US006963890B2

(12) United States Patent
Dutta et al.

(10) Patent No.: US 6,963,890 B2
(45) Date of Patent: *Nov. 8, 2005

(54) RECONFIGURABLE DIGITAL FILTER HAVING MULTIPLE FILTERING MODES

(75) Inventors: Santanu Dutta, Sunnyvale, CA (US); David Molter, Creteil (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 640 days.

This patent is subject to a terminal disclaimer.

(21) Appl. No.: 09/871,198

(22) Filed: May 31, 2001

(65) Prior Publication Data

US 2002/0184275 A1 Dec. 5, 2002

(51) Int. Cl.[7] .............................................. G06F 17/10
(52) U.S. Cl. ................................... 708/319; 708/316
(58) Field of Search ................................ 708/300, 301, 708/313, 316, 319

(56) References Cited

U.S. PATENT DOCUMENTS 5,206,821 A  *  4/1993  Young et al. ............... 708/313
5,339,264 A  *  8/1994  Said et al. .................. 708/319
5,892,695 A     4/1999  Van Dalfsen et al.
6,260,053 B1 *  7/2001  Maulik et al. .............. 708/313

* cited by examiner

Primary Examiner—Chuong Dinh Ngo
(74) Attorney, Agent, or Firm—Michael J. Ure

(57) ABSTRACT

A hardware-configurable digital filter is adaptable for providing multiple filtering modes. In one embodiment, the digital filter includes a register-based array of logic circuitry, computational circuitry and mode selection circuitry. By reconfiguring data flow within the logic circuitry and the computational circuitry, the mode selection circuitry switches the digital filter between different ones of the multiple filtering modes. Each of the multiplication and addition logic circuits has outputs and inputs selectably coupled to the other of the multiplication and addition logic circuits along a Y direction, with the selectivity being responsive to the mode selection circuitry for arranging the registers as being functionally linear or functionally nonlinear. In a more specific embodiment the filtering modes include polyphase filtering and general purpose filtering applications (such as FIR filtering), and in another more specific embodiment the filtering modes include polyphase direct filtering, polyphase transposed filtering, and at least one general purpose filtering. A specific example application of the above type of digital filter is directed to filtering video pixel components, for example, in resizing a horizontal line of pixels.

21 Claims, 11 Drawing Sheets

RECONFIGURABLE DIGITAL FILTER HAVING MULTIPLE FILTERING MODES

FIELD OF THE INVENTION

The present invention is directed to a hardware-architecture-based digital filter that is reconfigurable for different filtering modes.

BACKGROUND

Computer arrangements, including microprocessors and digital signal processors, have been designed for a wide range of applications and have been used in virtually every industry. For a variety of reasons, many of these applications have been directed to processing video data and have demanded minimal levels of power consumption and compactness. Some applications have further demanded a high-speed computing engine that can perform effectively on a real-time or near real-time basis. Many of these video-processing applications have required a data-signal processing circuit that is capable of performing multiple functions at ever-increasing speeds.

Unfortunately, achieving high data-processing speeds and providing multiple functions are opposing tensions. For instance, general-purpose video signal processing, which typically includes finite-impulse-response (FIR) or infinite-impulse-response (IIR) filtering, is relatively slow when compared to specialized video-data filter processing such as compressing and decompressing video data in real time. Because the computational architecture used in connection with specialized video-data filter processing is typically optimized to keep up with the real-time speeds of the video data, specialized video-data filter processing is typically not very efficient at performing the variety of tasks associated with general-purpose video signal processing.

Useful in some applications is a type of specialized video-data filter known as a "polyphase" filter. In video-processing applications, a polyphase filter is sometimes used to resize pixels by manipulating data stored to represent the horizontal and vertical lines used to refresh the display. In such applications, the ratio of the number of output pixels to the number of input pixels is defined as a zoom-factor; whereas, for general purpose filtering, the number of output pixels equals the number of input pixels. The resizing operation is also known as expansion or up-sampling when the zoom factor is greater than one; otherwise, resizing operation is typically known as compression or down-sampling. Normally, for resizing a picture (scaling up or down) to provide a fixed zoom, the polyphase filter is implemented with its coefficients defined as a function of the position or phase of the pixel that is being processed. For resizing in high-precision video applications, the polyphase filtering is implemented with a more unique architecture to accommodate the math required to achieve the precision; typically, this type of polyphase filtering is implemented in a form referred to as "polyphase-transposed" filtering. For the more typical video applications, the polyphase filtering is implemented as a polyphase direct filter using a computational architecture that is more common with general purpose filtering such as FIR filtering. Because of the requisite math respectively associated with general purpose filters and certain special-purpose filters such as in polyphase transposed filtering, architectural incompatibilities have resulted in these general purpose filters being designed separately from such special purpose filters. For further details and an example implementation of such a polyphase filter, reference made be made to U.S. Pat. No. 5,892,695, entitled, "Sample Rate Conversion," Van Dalfsen et al, assigned to the instant assignee and incorporated herein by reference in its entirety.

In each of the above video-processing applications, there is a significant cost in connection with designing, manufacturing and maintaining the integrated circuits used to provide such functionality. In each such application where the specified filtering modes are architecturally incompatible, the costs associated with the additional architectures are significant. Accordingly, there is a well-recognized need to develop a relatively compact video-processing filter architecture that accommodates these multiple filtering modes without a significant loss in data-processing throughput.

SUMMARY

The present invention is directed to a programmable digital filter that addresses the above-mentioned challenges and that provides a hardware structure that is reconfigurable for different types of filtering modes. The present invention is exemplified in a number of implementations and applications, some of which are summarized below.

According to one example embodiment, the present invention provides a hardware-reconfigurable digital filter having multiple filtering modes. The digital filter includes logic circuitry, mode selection circuitry and computational circuitry. The logic circuitry has an X-by-Y array of registers (wherein each of X and Y is at least 2) and is adapted to process input data. The mode selection circuitry switches the programmable digital filter between different multiple filtering modes, and the computational circuitry responds to the logic circuitry by performing computations and includes at least Y multiplication logic circuits and at least Y addition logic circuits. In more specific embodiments, each of the multiplication and addition logic circuits has outputs and inputs selectably coupled to the other of the multiplication and addition logic circuits along a Y direction, and the filtering modes include polyphase filtering and general purpose filtering applications (such as FIR filtering).

In other more specific embodiments the filtering modes include polyphase direct filtering, polyphase transposed filtering, and at least one general purpose filtering, and the above-mentioned array of registers is configurable as a linear array for selected general purpose filtering and arranged as a two-dimensional array for other selected filtering modes.

According to another more specific example embodiment, the present invention is directed to a similar hardware-reconfigurable digital filter, where the logic circuitry is adapted to process and mirror data corresponding to filter inputs about a data point corresponding to selected target node in a video image segment. The logic circuitry includes an X-by-Y array of registers, wherein Y is greater than X and X is at least 2. The mode selection circuitry is adapted to switch the programmable digital filter between a polyphase transposed filtering mode and at least one other mode of the multiple filtering modes. The computational circuit is adapted to perform computations responsive to the logic circuitry and including at least Y multiplication logic circuits and at least Y addition logic circuit, each of the multiplication and addition logic circuits having outputs and inputs selectably coupled to one another with the selectivity being responsive to the mode selection circuitry.

Other aspects and advantages directed to specific example embodiments of the present invention.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention, which follows in connection with the accompanying drawings. These drawings include:

In accordance with the present invention, FIGS. 1 and 2 respectively illustrate a general block diagram of an example reconfigurable digital filter, and a particular example top-level micro-architecture of a whole functional unit with application to a specific example environment for using the reconfigurable digital filter.

FIGS. 3 through 8 respectively illustrate expanded implementations of modules shown in FIG. 2, also according to the present invention. More particularly:

FIG. 3 illustrates a clock generator module;

FIG. 4 illustrates a state-diagram of the top-level Finite State Machine (FSM) module used in connection with loading filter coefficients and reading & writing filtering data;

FIG. 5 illustrates an example implementation, in the form of a state table, for a finite-state machine that is used to read in a programmed number of coefficients, used in connection with the modules of FIG. 2;

FIG. 7 illustrates the central configurable filter module providing operation control and general processing functions;

FIG. 8 is a data circuit/flow diagram depicting a central filter macro-module including a datapath module and a control module shown in FIG. 2, also according to the present invention;

Figure 1:
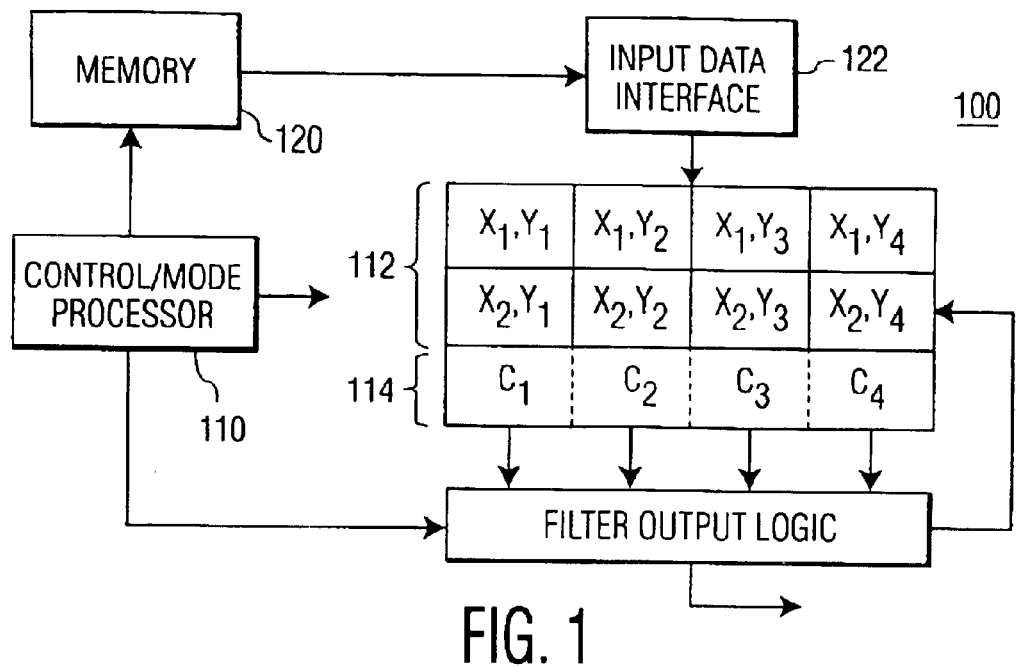

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DISCLOSED EMBODIMENTS

The present invention is believed to be applicable to a variety of different types of filtering applications, and has been found to be particularly useful for video filtering applications benefiting from a digital filter architecture that can be readily reconfigured to operate in any of a plurality of filtering modes. Various aspects of the invention may be appreciated through a discussion of examples using these applications.

A first example embodiment of the present invention is illustrated in FIG. 1. FIG. 1 provides a hardware-reconfigurable digital filter 100 having selectable filtering modes. The digital filter 100 includes mode selection circuitry 110, logic circuitry 112, and computational circuitry 114. The logic circuitry 112 has an X-by-Y array of registers and is adapted to process input data passed from memory 120 and into input data interface logic 122. The computational circuitry 114 responds to the logic circuitry 112 by performing computations using, within each of the $C_Y$ blocks of the computational circuitry 114, a multiplication logic circuit and an addition logic circuit. The skilled artisan will appreciate that the X-by-Y array of registers is depicted as a 2×4 array for illustrative purposes only and that a specific implementation or selection of filtering algorithms will dictate the actual size of the array. The mode selection circuitry 110 is depicted as including a processor and thereby providing both control processing operations for the filter 100 as well as filtering mode selection operation; another particular application, however, might dictate that the processor portion of the mode selection circuitry 110 and the mode selection logic be implemented separately.

The manner in which the mode selection circuitry 110 switches the digital filter 100 between different multiple filtering modes depends upon the particular application. For instance, one example application is directing to a first filtering mode involving a first high-precision type of filtering, such as polyphase transposed filtering, and to a second filtering mode involving a more common type of filtering operation, such as an impulse response filtering operation. In this case, the mode selection circuitry 110 commands the orientation of the multiplication logic and addition circuits in each of the $C_Y$ blocks to reconfigure the digital filter 100 for one of these two modes. In one specific embodiment, each of the multiplication and addition logic circuits has outputs and inputs that permit computations to be oriented as designated by command signals received from the mode selection circuitry 110. Thus, for the first high-precision type of filtering, the mode selection circuitry 110 commands a different orientation for the multiplication and addition logic circuits to optimize throughput for the algorithms used by the particular type of high-precision filtering, and for the second more-common filtering mode the orientation is unchanged the setting used for the second mode. Optionally, one of these two modes can be used as a default mode.

Another example application is directing to first and second filtering modes, each involving different types of the second more-common filtering. Examples of such filtering modes include polyphase direct filtering, and different types of impulse response filtering such as M-tap FIR and N-tap FIR filtering (M and N being integers, e.g., greater than 2). For many of these types of more-common filtering modes, the mode selection circuitry 110 can reconfigure the filter 100 by controlling the orientation and communication of data between registers in the respective cells of the logic circuitry 112, and without changing the orientation of the multiplication logic and addition circuits in the computational circuitry 114. One such specific embodiment, where the orientation of the multiplication logic and addition circuits in the computational circuitry 114 is not required to be changed, employs the mode selection circuitry 110 to control the logic circuitry 112 for switching between polyphase direct filtering and at least one general purpose filtering such as FIR filtering.

Also according to the present invention, a specific video-processing application employs a horizontal filtering unit ("HFL"), similar to the filter 100 described above, to implement a polyphase filter that "resizes" a horizontal line of pixels stored in memory blocks (e.g., 120 of FIG. 1). In this context, "resizing" is as described above with expansion occurring when the zoom factor is greater than one. Normally, a fixed zoom is used (for the polyphase filter) to scale a picture (up or down), the filter coefficients used being variable, depending on the position or phase of the pixel that is being processed. With proper programming, the filter can also have a polyphase filter mode that causes the filter to vary the zoom factor for every output pixel, e.g., in a processing step executed by a micro-programmed control processor adapted to supervise the functionality of the digital filter. Typically one would adjust the filter's control parameters to have the zoom factor approach unity towards the center of the output line, but progressively larger or smaller zoom factor towards the two edges of the line. This feature is known as variable or panoramic zoom and is useful for adjusting the aspect ratio of the input video to fit the entire physical screen.

In one example application, a micro-programmed master control processor (MCP) is used to provide the control and background and the on-chip video processing operations for the digital filter. The MCP processing the display pixels using "processing steps," where one processing step refers to the number the MCP operations needed to process data corresponding to a maximum number of input pixels for producing a maximum number of output pixels. In a particular example, 256 are the maximum number of input pixels for producing a maximum of 256 output pixels. Under the normal mode of operation, the various on-chip video processing units (horizontal filters, vertical filters, blenders, color keying, etc.), the memories, and the connection crossbars can be programmed (via micro-code in the MCP) so that each processing step and the computation start correctly. While this processing step is in progress, the control values for the next processing step are programmed into the holding registers for the next processing step. The control values for the next processing step are then passed from the holding registers into the working registers at the start of the next processing step, and the process repeats.

For many typical applications, each HFL of FIG. 1 is primarily used for horizontal up- or down-scaling of the pixel components. In one particular example application, the HFL is a general purpose FIR filter which can be configured by programming its control registers to operate in one of the following modes during a processing step: polyphase direct mode, polyphase transposed mode, FIR11 or Odd-Tap FIR mode (11-tap FIR with even symmetry), and FIR12 or even-tap FIR mode (12-tap FIR with even symmetry).

An important advantage of using the polyphase modes of the HFL is the ability to resize a horizontal line of pixels (stored in memory blocks). As such, the ratio of the number of output pixels to the number of input pixels is defined as the zoom-factor. The resizing operation is also known as expansion or up-sampling when the zoom factor is greater than one; otherwise, this ratio is known as compression or down-sampling. The allowed range of the zoom-factor can be selected to be any value; in this example design, the allowed range is from 0.25 to 8.00 (both limits inclusive). With proper programming, it is also possible to have the HFL vary the zoom factor for every output pixel in a processing step. The HFL control parameters are adjusted to have the zoom factor approach unity towards the center of the output line, but progressively larger or smaller zoom factor towards the two edges of the line:

This resizing feature is called variable or panoramic zoom and is useful for adjusting the aspect ratio of the input video to fit the entire physical screen (e.g., 16:9 picture onto a 4:3 screen and vice versa).

The FIR modes on the other hand are used for general-purpose filtering (where the number of output pixels equals the number of input pixels). The number of input pixels to be consumed and the number output pixels to be produced, by the HFL in each processing step, are programmed by the user to be between 1 and 256 (inclusive) (256 is programmed by setting the count to "0"). The critical states, or "context", of the HFL at the end of a processing step can be saved to a memory block under software control. This context can be reloaded as the initial states at the beginning of the next processing step, so that the two processing steps can be regarded as a single continuous step. This mechanism of saving and loading context allows an HFL to service multiple input lines simultaneously such that each processing step can be applied to a different input line in a round-robin fashion until every input line is processed to its entirety. The contents of an HFL context depend on the mode of operation (the particular filtering mode). Saving and loading context is not required if the input line is processed completely before switching to another input line because the HFL, by default, carries the ending states from the last processing step over as the initial states in the next processing step.

For further information regarding use of a polyphase filter for such expansion or compression, reference may be made to the embodiments illustrated and described in the above-mentioned U.S. Pat. No. 5,892,695.

Each HFL contains two independent banks of filter coefficients, each coefficient corresponding to a signed binary number (e.g., 10-bit numbers in the range [−0.5,0.5]). The filter coefficients are loaded from memory blocks similar to the manner in which the input pixels and the context are loaded. Filtering of pixels and loading of coefficients can occur in parallel during a processing step, since each process accesses a different bank of coefficients.

Implementations of the reconfigurable HFL of FIG. 1 advantageously support two polyphase filter modes: polyphase direct (for both expansion and compression) and polyphase transposed (for compression only) for up-sampling and down-sampling (scaling of pictures) and at least two general purpose FIR filter modes (for digital-filtering based signal processing). Further, the HFL of FIG. 1 supports zoom factor from 0.25 to 8.00, supports variable zoom factor, can be implemented to use signed 10-bit filter coefficients only, can support 8-bit and 10-bit input pixel formats, holds two banks of filter coefficients and allows filtering of pixels from one bank of coefficients and loading of coefficients into the other to proceed in parallel, allows switching between 32 phases and 64 phases in polyphase modes thereby permitting selectivity of filter coefficients, and provides a mechanism to save and load context and, therefore, supports switching back and forth among multiple long input lines at each processing step. Further, the HFL can be adapted to support mirroring of pixels (at the beginning and the end of lines.

Figure 2:
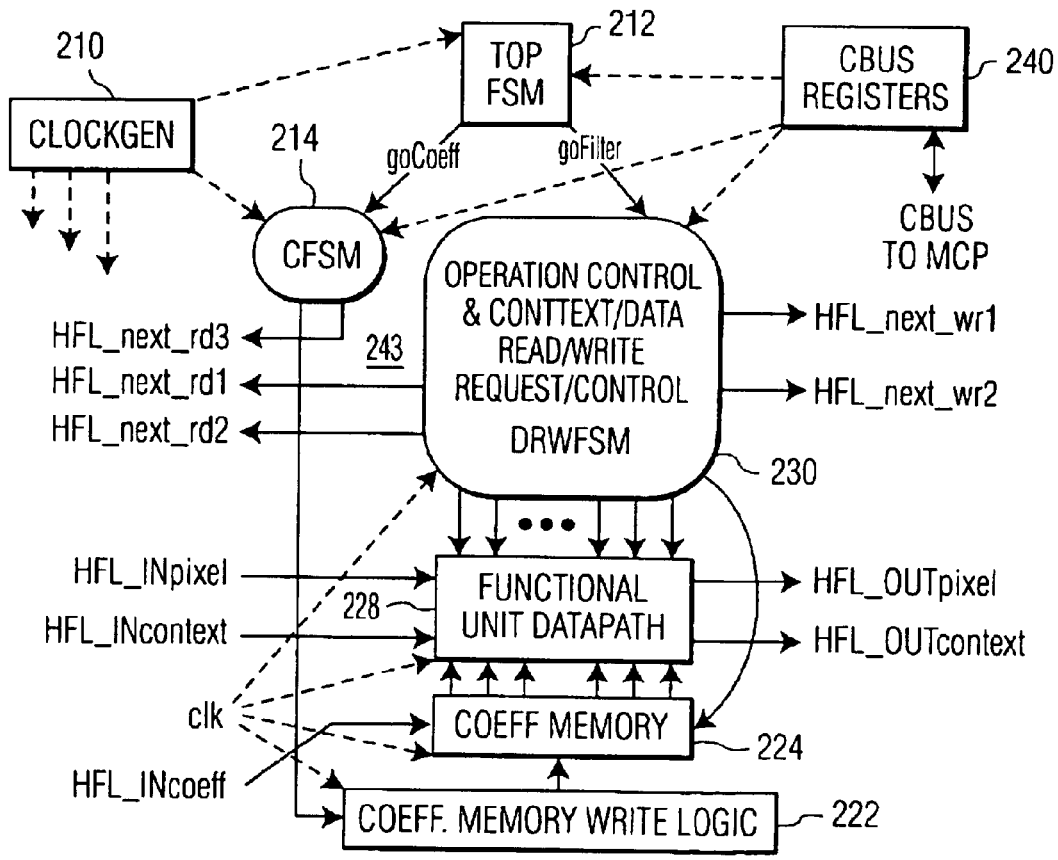

For one particular example application, FIG. 2 illustrates a top-level micro-architecture using the approach shown in FIG. 1 for implementing a reconfigurable digital filter. The architecture arrangement of FIG. 2 includes a clock generator module 210 (shown in more detail in FIG. 3); an initiator module 212 used to direct reading of filter coefficients and loading of filtering data (shown in more detail in FIG. 4); illustrates a CR (coefficient-read) module 214 used to generate control signals for causing filter coefficients to be accessed (shown in more detail in FIG. 5); a CRAM (coefficient-ram) access module 222 (shown in more detail in FIG. 7); a CRAM (coefficient-ram) memory module 224 (shown in more detail in FIG. 7); and a central filter macro-module including datapath module 228 and control module 230 (shown in more detail in FIG. 8).

Generally, the filter unit or arrangement of FIG. 2 processes data in response to instructions from the initiator (or "top FSM") module 212, which is always active. The initiator module 212 instructs the lower-level filter modules to initiate coefficient-reads and filtering operations. The coefficient-read module 214 generates the control signals for coefficient access module 222, and is the main module responsible for generating control signals to the datapath module 228 and control module 230, as well as the externally-coupled devices. Thus, the coefficient-read module 214 is responsible for reading in input data, reading coefficients from the coefficient memory, writing out processed data, reading in context, and writing out context.

In one example system implementation, the filter unit is one of a number of functional units that are programmed by a micro-programmed master control processor (MCP) via programming of the filter unit's memory-mapped control registers (not shown). Each unit also has a set of input and output data ports that are connected to a pool of memory banks through a "crossbar network" (thus, the memories in this pool are also referred to as "crossbar memories"). Associated with each data port is a next_location signal generated by the unit; the task of this signal is to indicate to the memory bank(s) to update its address counter to be ready for the next read or write operation. This "next_location" signal corresponds to a "next_read" signal for an input port and a "nex_write" signal for an output port signal. The communication protocol between the unit and the MCP uses two sets signals each set featuring a pair of signals. The MCP, after writing a set of values to the working memory mapped input-output (MMIO) registers of the unit, sends a load_conf signal requesting the functional unit to load its configuration parameters from the working to the shadow MMIO registers. The unit acknowledges the request by sending a conf_loaded signal to indicate to the MCP that it has updated its internal configuration for the next sequence of operation and is ready to start. At this point, the MCP issues the start signal (of course, when all units in the system have loaded their configurations) to the unit which, at the end of the current sequence of operations, notifies the MCP by sending an end_operation signal that the current sequence of operations are completed. The approach of using working and shadow registers allows the MCP to program the next sequence of operations (for the next processing step) while the current sequence of operations (in the current processing step) is still in progress. This concurrent operation minimizes system latency.

In context of one example application system, the basic operation of the filter unit can be viewed as including the following processing steps: first programming the filter (via MCP-based MMIO register programming) to read filter coefficients from the crossbar memory (note that a preprocessing step loads the crossbar memory with required values from an external SDRAM via MCP-based programming of a memory-interface module that is not part of the HFL but is responsible for fetching coefficient and pixel data from the off-chip SDRAM to the on-chip crossbar memories) and fill its internal coefficient memory (module 224 in FIG. 2) in one processing step, and, in the next processing step, programming the unit to read actual video data, once again from another crossbar memory and producing filtered outputs (using the filter coefficients for the calculations). The filtered outputs are subsequently written to a crossbar memory (via the HFL_next_wr1 signals on the data-write port HFL_OUTpixel, as shown in FIG. 2). Depending on the state of processing, the filtered values are further processed by another video-processing unit, or sent off-chip to be displayed on a screen after appropriate format conversion and sync insertion. Reading filter coefficients from external memory occurs via the HFL_next_read3 signal, which is associated with the coefficient-read port HFL_Incoeff (FIG. 2). Programming the unit to read actual video data from memory occurs via the HFL_next_read1 signals but this time on the data-read port HFL_IN pixel (FIG. 2).

Figure 5:
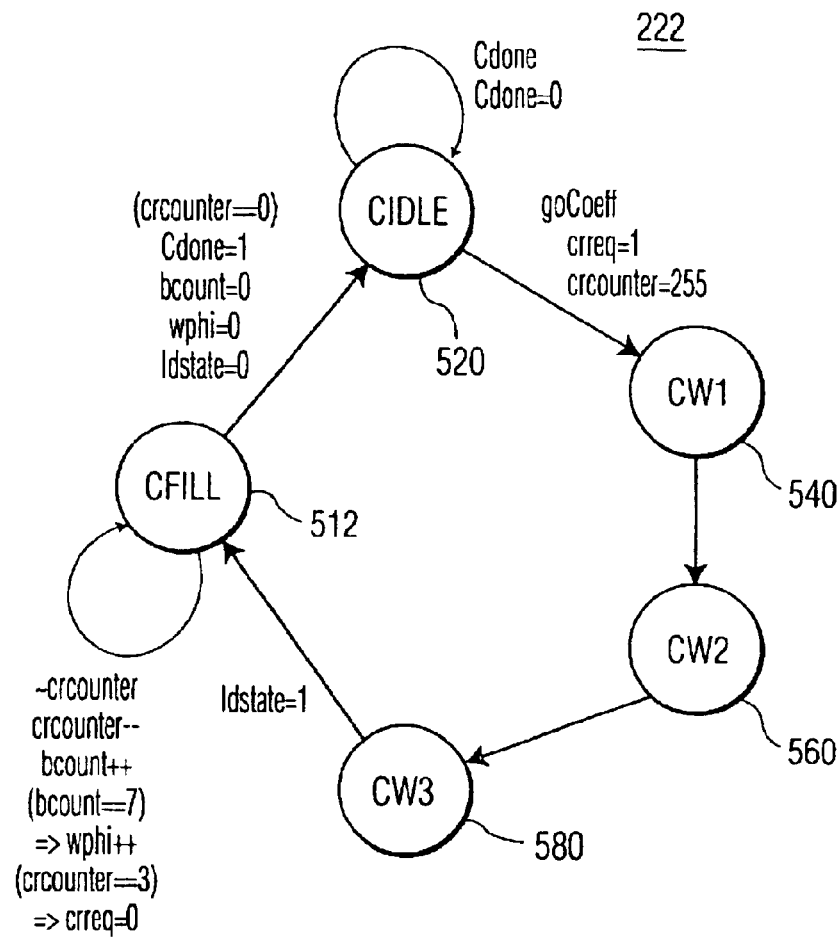

Other system-use aspects include having a 3-cycle latency for memory-read operations (as is evident from the wait cycles shown in the state-machine diagram in FIG. 5) and a 2-cycle latency for memory-write operations. Because the filter can perform up- or down-sampling, it essentially changes the output flow relative to the input data; for compression, the filter reads more pixels but produces fewer outputs, whereas the reverse is the case for expansion. The filtering unit also allows context switching (switching of operations from one video line to another), if so programmed by the MCP. Referring to FIG. 2, this can be achieved via context-read (HFL_next_rd2) and context-write (HFL_next_wr2) signals associated with a pair of dedicated read (HFL_INcontext) and write (HFL_OUTcontext) ports for context data.

Once the HFL of FIG. 2 is programmed by the external processor (e.g., MCP), via programming of HFL's internal memory-mapped control bus (CBUS) registers (CREG), the initiator module 212 checks the cbus registers 240 to decide whether it is a NOP ("no operation" required) in which case the initiator module 212 generates a code to instruct that the processing is at the end-of-operation mode. In the OP mode, the initiator module 212 reads the cbus registers 240 once again to decide whether it is a COEFFICIENT-READ operation or a FILTERING operation. For a COEFFICIENT-READ operation, the initiator module 212 instructs the coefficient-read module 214 to read control coefficients via the third data input 242 and write them into CRAM memory module 224 via coefficient access module 222. For a FILTERING operation, the initiator module 212 instructs the central filter macro-module to read data and/or context values on the data and/or context inputs. These inputs are multiplied by appropriate coefficients (from the coefficient memory) in the functional-unit datapath module 228 to produce the required outputs that are written to the external HFL memories, "XBAR" or Crossbar memories which interconnect with the HFL memories by module 230 under the supervision of the initiator module 212.

Figure 3:
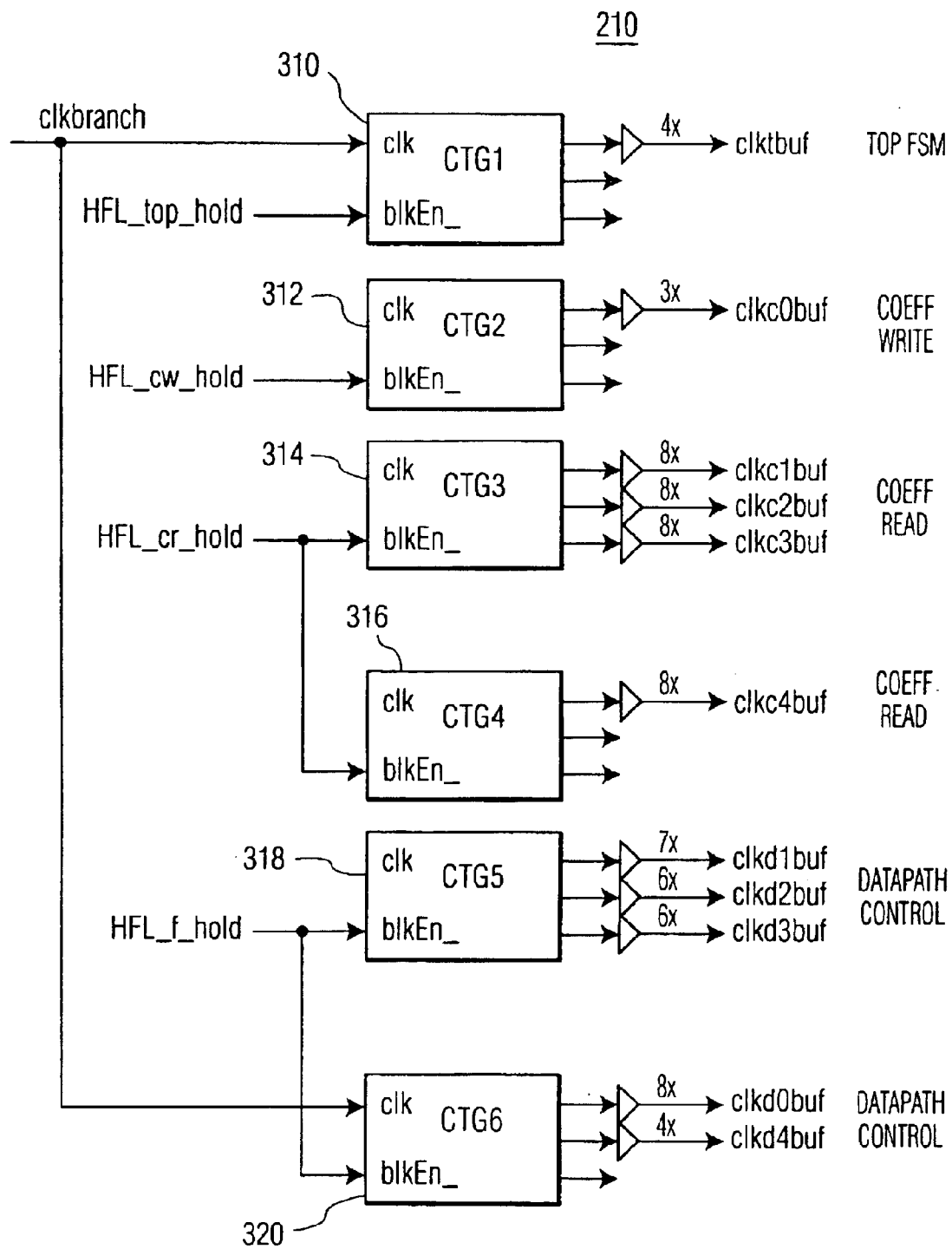

FIG. 3 illustrates the clock generator module 210 of FIG. 2 in expanded form. The clock generator module 210 includes several clock tree gates ("CTG") which are responsible for generating the gated and appropriately buffered (for correct balancing) clocks used by the other modules shown in FIG. 2. For an optional power-savings mode, the first CTG 310 is enabled either in a scan mode or in a non-scan mode when an optional power-down mode is not asserted. The first CTG 310 feeds the initiator module 212 (that needs to remain ON all the time, except for powerdown). The CTG 310, along with CTG 312, 314, 316, 318 and 320 are enabled by signals HFL_top_hold (in case the HFL needs to be shutoff in the powerdown mode), HFL_cw_hold (to shut off the coefficient-write logic in case coefficients are not being written), HFL_cr_hold (to shut off the logic to read coefficients from external memory), and HFL_f_hold (in case the filter datapath is inactive either because of NOP or because only coefficients are being read in the current processing step), which are generated by power-management logic (not shown). The CTG 312 is enabled (except for power down) because the top-level state machine stays active and responds to one of the three programming modes (NOP, coefficient read, filter processing). CTG2 312 generates the coefficient write clock that feeds the coefficient-write state machine (FIG. 5) and associated write logic. In response to the clock twig HFL_cr_hold, the CTGs 314 and 316 are also enabled until the end of operation, when HFL is programmed in the OP mode, for coefficient reading. In response to the clock twig HFL_cr_hold, the CTGs 318 and 320 are also enabled until the end of operation, when HFL is programmed in the OP mode, for filtering operations. Optimal dynamic power-management is affected by enabling the CTGs only at the appropriate times and only when necessary.

FIG. 3 illustrates a clock generator module intended to provide multiple clock branches (from one main clock branch), where the sub-branches, more appropriately called twigs, fan out, driven by strong buffers, to different logic blocks/parts. This branch approach is useful in view of the limited amount of logic that one clock-branch can drive within acceptable clock-skew limits, and this scheme is also useful to enable selective, clock-shut-off on branches feeding inactive logic (depending on the filtering mode) thereby saving power.

Figure 4:
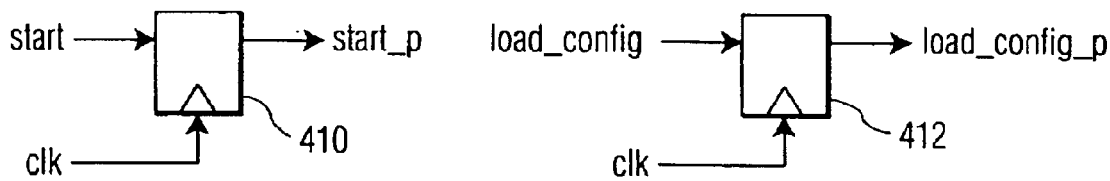
Figure 4:
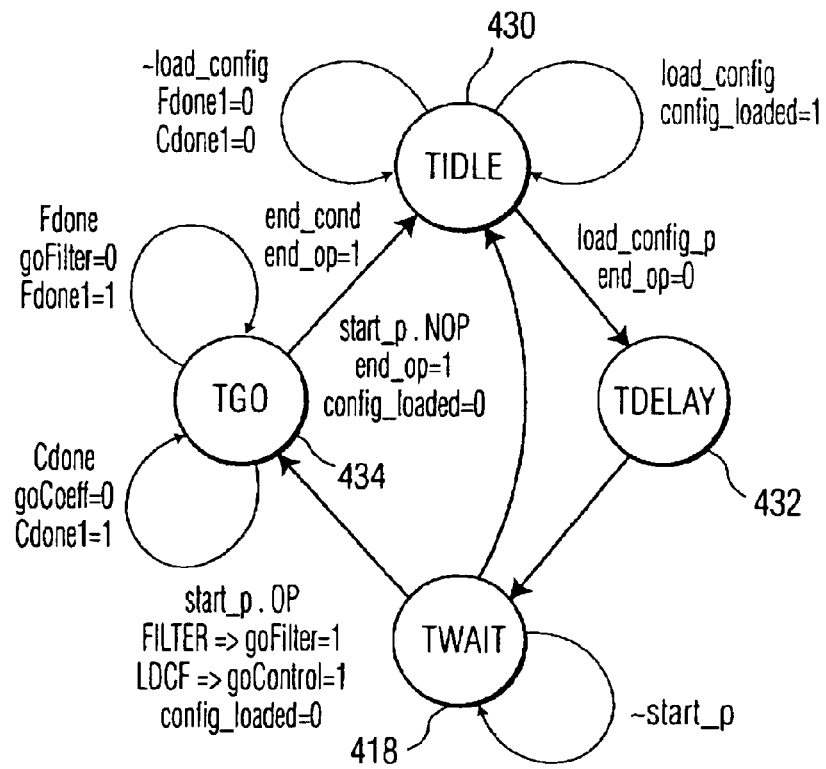

FIG. 4 illustrates the functionality of the initiator module 212 of FIG. 2. The initiator module 212 is used to direct the reading of filter coefficients and the loading of filtering data, which occur in different processing steps. The initiator module 212 controls the modules (222 and 230) that affect the coefficient and data read and data write tasks, and also controls the communication protocol between the main external (to the HFL but on-chip) micro-programmed master control processor (e.g., MCP) and the HFL unit. The state-diagram of the top-level Finite State Machine (FSM) associated with module 210 of FIG. 2 is used in connection with loading filter coefficients and reading & writing filtering data. The FSM generates control signals for causing filter coefficients to be read from outside memory in one processing step (goCoeff=1) or for causing input values to be read and the filtered outputs to be produced in another processing step (goFilter=1). Once the process is over (via Cdone or Fdone being 1), the state-machine returns to the idle state and waits for the next processing step. The load_config signal is used to load the configuration via the programming in the registers.

As depicted in the state-diagram portion of FIG. 4, the initiator module is activated at state 418 in response to receiving the load_config command (at flip-flop 412 from the MCP and only after being enabled by a start command at flip-flop 410), and transits to either to state 430 or state 432. The flip-flops are there only for timing reasons, so that the global signals (load_config and start) from the MCP do not drive the top-level state-machine (in multiple HFL-like video-processing units on-chip) directly (thereby seeing a large load and leading to a slow response) but get registered and the locally registered versions in each module (e.g., HFL) drive the FSM. The initiator module transits to state 430 in response to receiving a start.NOP (i.e., a start signal when programmed in the NOP mode) command, and then transits to a delay state 432 before returning to the wait state 418. The initiator module transits to state 434 in response to receiving a start.OP (i.e., a start signal when programmed in the OP mode) command and remains at state 434 while the filter is reconfiguring and processing. The initiator module transits to idle state 430 in response to receiving an end-condition or end-of-operation signal where the initiator module idles until receiving a Cdone or Fdone signal from the read or write module) and finally a load-configuration end-of-operation signal and then returns, via idle state 432, to the wait state 418.

The inputs to the initiator module 212 of FIG. 4 include: load_config which is provided from the MCP and is used to load configuration (control values) from shadow to working CBUS registers (240 FIG. 2) and de-assert end_op (end of operation) one cycle after loading; start which is provided from the MCP to start operation after de-asserting config_loaded output signal; Cdone which is provided from the coefficient-read module (222 of FIG. 2) to signify the end of coefficient read (processing step); Fdone which is provided from the operation module (230 of FIG. 2) to signify the end of filtering and data write operation (a processing step) which signifies the end of context if programmed in such a mode; HSRC_CTRL[7:0] which is provided from a memory-mapped input-output ("MMIO") mode-control CBUS register and used to pass the control commands; tfsm_clk which is the input clock provided by the clock module (210 of FIG. 2) to the top-level FSM; and resetBar which is an asynchronous reset signal (active low) used to reset not only the initiator module 212, but also the HFL as a whole.

The outputs to the initiator module 212 of FIG. 4 include: start_p which is the registered start signal going also to the other modules of FIG. 2; config_loaded which is a signal to the MCP asserting the end of configuration loading for the filter; end_op which indicates to the MCP that processing is complete; goFilter which signals to the data read/write portion of the main module 230 to start reading, processing, & writing data; and goCoeff which is a signal to the coefficient-access module 222 to start reading coefficients.

FIG. 5 illustrates a state table of the coefficient-access module 222 (of FIG. 2) used to generate control signals for causing the filter coefficients to be read (coefficient-read requests) from memory in response to instructions from the initiator module (212 of FIG. 2). The coefficient-access module 222 also generates the control signals for selecting the correct memory bank and writing the coefficients in the bank. The coefficient-access module 222 receive the following inputs: HSRC_MODE[7:0] which corresponds to the 8-bit MMIO register (not shown); goCoeff which is the signal from the initiator module signifying the start of coefficient read operations; cfsm_clk which is the input clock from the clock module (210 of FIG. 2); and resetBar which is the asynchronous active-low reset signal as previously discussed. In one example implementation, the state table of FIG. 5 depicts the state operation of a finite-state machine used to read in the programmed number (in crcounter) of coefficients, CWi (i=1 to 3) being the 3 states compensating for the 3-cycle read-latency in the used system.

The coefficient-access module 222 generates the following outputs: HFL_next_rd3 which is the read-request signal for reading coefficients; Cdone which is the read-done signal to top FSM signifying end of coefficient read; wphi [4:0] which is the phase counter specifying one of the 32 phases for which 6 coefficients are being read and written in the coefficient memory; bcount[2:0] which is the byte-count signal that increments from 0 to 7 and goes to the HFL_coeff_ram_block (that houses the coefficient memory) to allow reading of 8×8=64 bits that finally form 6 10-bit coefficients for a particular phase (Four bits (64−10×6) remain unused); ldstate which specifies that the FSM is in correct coefficient-loading state (useful for enabling the write operations in the actual memory blocks in HFL_coeff_ram).

The state table of FIG. 5 relates to the coefficient read FSM—HFL_cread_fsm or CFSM (FIG. 2) - - - that is responsible for reading the required number of coefficient values from the crossbar memory and writes to the coefficient memory (module 224 in FIG. 2) via the coefficient-memory write logic (module 222 in FIG. 2). The request signal, crreq, is the same as HFL_next_rd3 (from 214 of FIG. 2) and is asserted three cycles before starting to write the coefficients in the coefficient memory (in state 510); thus, once crreq is raised in state 520, the state machine traverses the three idle states 540, 560 and 580, before the coefficient data start streaming in from the memories. State 520 is the stable state where this coefficient-read state-machine waits for the goCoeff signal from the top-level state machine (212 of FIG. 2) to start its operation. Once started, when the data starts coming after a latency of three clock-cycles, the state machine reaches the coefficient-fill state 510 where the correct memory bank is filled with the coefficients. A coefficient-read counter (crcounter), is initialized to 255 (256 coefficients to be read) and used to decrement the count down every clock cycle in this state. Once the required number of coefficients have been read (when the crcounter value reaches 3, in order to account for the 3-cycle latency), the Cdone flag is raised and the state-machine jumps to its idle state. The Cdone flag is used by the top-level state machine to signal the end of the coefficient-read operation to the MCP.

Note that in a 32-phase mode, either the lower or the upper 32 phases of each 64-phase memory bank is written. This signal wphi (denoting write phase) keeps track of the current phase (for which the coefficient-set is being read and written) for any half-bank, and "bcount" (byte count) is the byte-enable in HFL_coeff_ram. In addition, wphi is incremented every time six new 10-bit coefficients are read and written in the coefficient memory (corresponding to a new phase); the 60 bits are read using eight 10-b reads (where the lower two bits of the read 10-b word are discarded every time) where the 8×8=64 useful bits form the 60 bits of the 10 coefficients (4 bits being unused) and the 8 bytes read are written using 8 values of the byte-enables (bcount). The signal crcounter, at any point, keeps track of the number of reads that have happened and is initialized to 255 so that a count-down to zero reads all 256 (=32 phases×8 reads for 6 coefficients per phase) values.

Figure 6A:
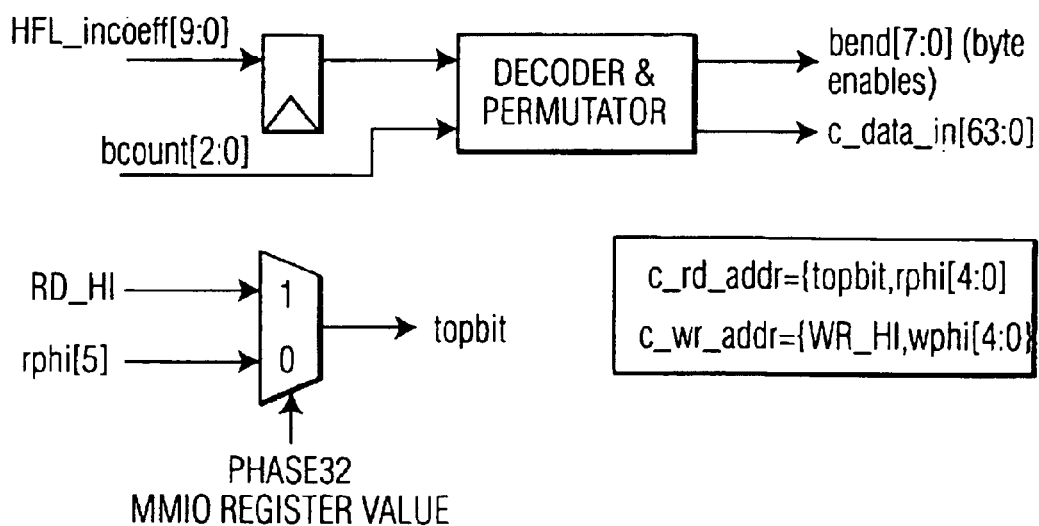
FIG. 6A illustrates a partial logic for the coefficient-ram module of FIG. 2
Figure 6B:
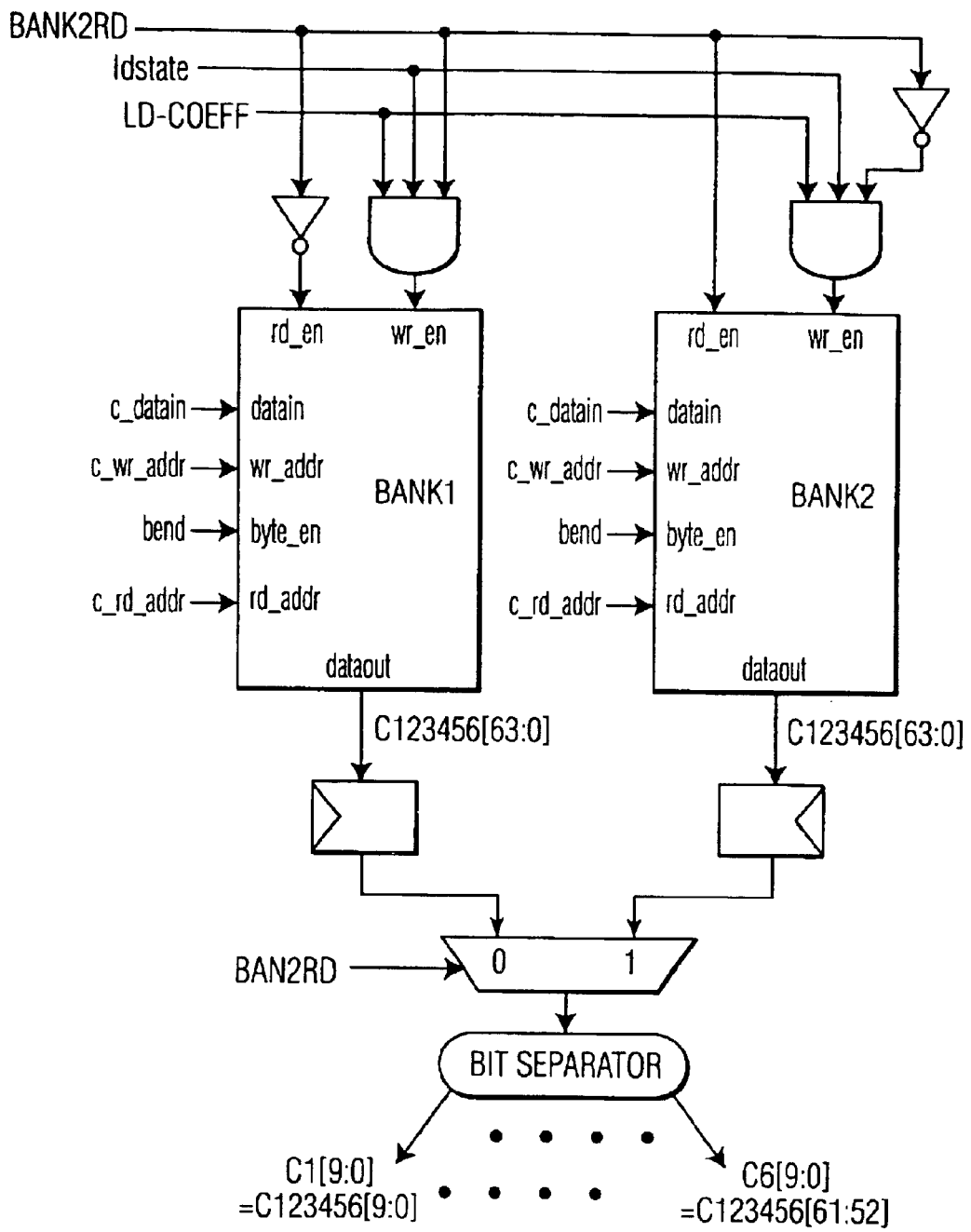
FIG. 6B shows the general configuration of coefficient reads into the internal coefficient memory of FIG. 2.

FIGS. 6A and 6B illustrate the coefficient-memory module 224 of FIG. 2. FIG. 6A illustrates a partial logic for the coefficient-ram module and FIG. 6B shows the general configuration of coefficient reads from the crossbar memory into the coefficient memory or coefficient ram (module 224 in FIG. 2) internal to the HFL unit. There are two of these memories permitting one memory to be filled while the other one, previously filled, is being used for filtering in the current processing step.

This module gets the various control signals from the coefficient-read FSM (HFL_cread_fsm) and is responsible for actually writing the coefficients in the coefficient-memory banks. Logic in this module is also responsible for reading 6 coefficients needed in each step in the filtering operation. There are two memory banks where each bank can store 64 sets of coefficients; one set of six 10-bit coefficients for each of the 64 phases, and while one bank is used to read coefficients from for the filtering operation, the other bank can be loaded with a different set of coefficients to be used in a different processing step.

Inputs to the coefficient-memory module 224 include: MMIO registers HSRC_CTRL[7:0] and HSRC_MODE [7:0]; wphi[4:0] which is a phase counter signal from the cread module specifying one of the 32 phases for which 6 coefficients are being read and written in the coefficient memory; bcount[2:0] which is a byte-count signal from the cread module and incrementing from 0 to 7 and for changing to the coeff_ram block to allow reading of 64 (8×8=64) bits that finally form 6 10-bit coefficients for a particular phase (four bits (64−10×6) remain unused); rphi[5:0] which is 6-bit coefficient-read phase or coefficient-read address from HFL_dp_cntrl. The main state machine section (FIG. 7) controls the filter operations by re-configuring the datapath for various operation including coefficient read, data read, data processing, data write, pixel mirroring, context switching, etc.) and is equal to the 6 MSBs of fractional part of IFC, the counter that keeps track of the current pixel position; clk1 which is the read clock for bank1; clk2 which is the read clock for bank2; clk3 which is the clock for register at bank1 out; clk4 which is the clock for the register at bank2 out; resetBar which is the asynchronous active-low reset signal; HFL_INcoeff[9:0] which is the signal input from XBAR memory where 8 MSBs have the correct values; ldstate which is the boolean-valued signal from HFL_cread_fsm announcing whether the FSM is in the coefficient-loading state (CFILL). OUTPUTS are the coefficients read for filtering operation, which are denoted C1, C2, C3, C4, C5, C6 [9:0].

For each memory bank, HFL_coeff_ram instantiates HFL_coeff_bank, which is a module containing the actual memory instance "m64×64core_shell" generated by a memory generator.

With reference to FIGS. 6A and 6B, the design and operation of the block (for coefficient-memory read/write) are as follows: BANK2RD is an MMIO control signal (from the CREG) that chooses, by ensuring a high value at the rd_en (read enable) input of the memory bank, one of the two banks for reading coefficients from during filtering operations (the other one being the one that may be written to). Enabling the selected memory bank for writing the coefficients depends on the simultaneous (AND) existence of three conditions: 1) the correct coefficient loading state (from the coefficient-read FSM); 2) the load-coefficient (LD_COEFF) command as programmed into the CREG by the MCP signifying that the current processing-step is meant to load coefficients; and 3) the correct write-enable (=1) being connected memory bank to write (which is the one that is not being read and, therefore, is the complement or inverse of the one being read). Once the write condition for a bank is set, the coefficient-read state machine starts cycling through its states, and the coefficient data starts to flow in on the HFL_INcoeff port of FIG. 2 (one every clock cycle) in response to the crreq (=HFL_next_rd3 in FIG. 2) being asserted.

The write operation proceeds as follows: 1) the byte count (bcount in FIG. 5) starts incrementing every clock cycle from an initial value of 7; 2) depending on bcount, the byte-enable (bend in FIGS. 6A and 6B) is set so that the correct sub-byte is written in the memory bank; 3) 8 bytes, counting bcount from 0 to 7, for the six 10-bit coefficients, are written in 8 consecutive clock cycles at each address, signifying the phase as well, of the memory bank; 4) every-time byte-count reaches 7 and rolls over, implying that all 6 coefficients for a phase is written, wphi, initialized to 0 and connected to the memory-write-address, is incremented by one so that the next memory location starts getting filled with the coefficients corresponding to the next phase value; and 5) this continues when all 256 coefficients are written to the memory bank. Note that the most-significant bit of the write address is hard-wired to the CREG WR_HI (as shown in FIG. 6A) so that either the upper or the lower 32 phases are written in any processing step; in case coefficients for all 64 phases are to be written in the memory bank, the whole process is to be repeated once again by flipping the value of WR_HI (done by the MCP) so that there are two consecutive coefficient-read processing steps before the filtering operation starts.

During the normal filtering operation, the coefficients are read from the memory bank for which read is enabled by MCP programming of the BANK2RD CBUS register (0 implies bank1 is read) and whether the filter is running in 32- or 64-phase mode depends on the PHASE32 CBUS register value. The 6 bits of the memory read address (c_rd_addr in FIGS. 6A and 6B) are a function of the read phase (rphi) as determined by the pixel position calculation in the main datapath control state machine module (HFL_dp_cntrl); however if only 32 phases are used for filtering, the uppermost most-significant bit of the 6-bit memory-read address is obtained from the RD_HI CBUS register (as shown in FIG. 6A); thus, if PHASE32=0, all 64 phases are used during filtering and c_rd_addr is essentially equal to all 6 bits of read phase (rphi[5] in FIG. 6A being multiplexed into topbit), whereas if PHASE32=1, the uppermost bit of c_rd_addr comes directly from the RD_HI control register (where a value of 1 implies the upper 32 addresses or the top half of the selected memory bank and a value of zero implies the reverse).

Figure 7:
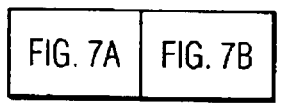
Figure 7A:
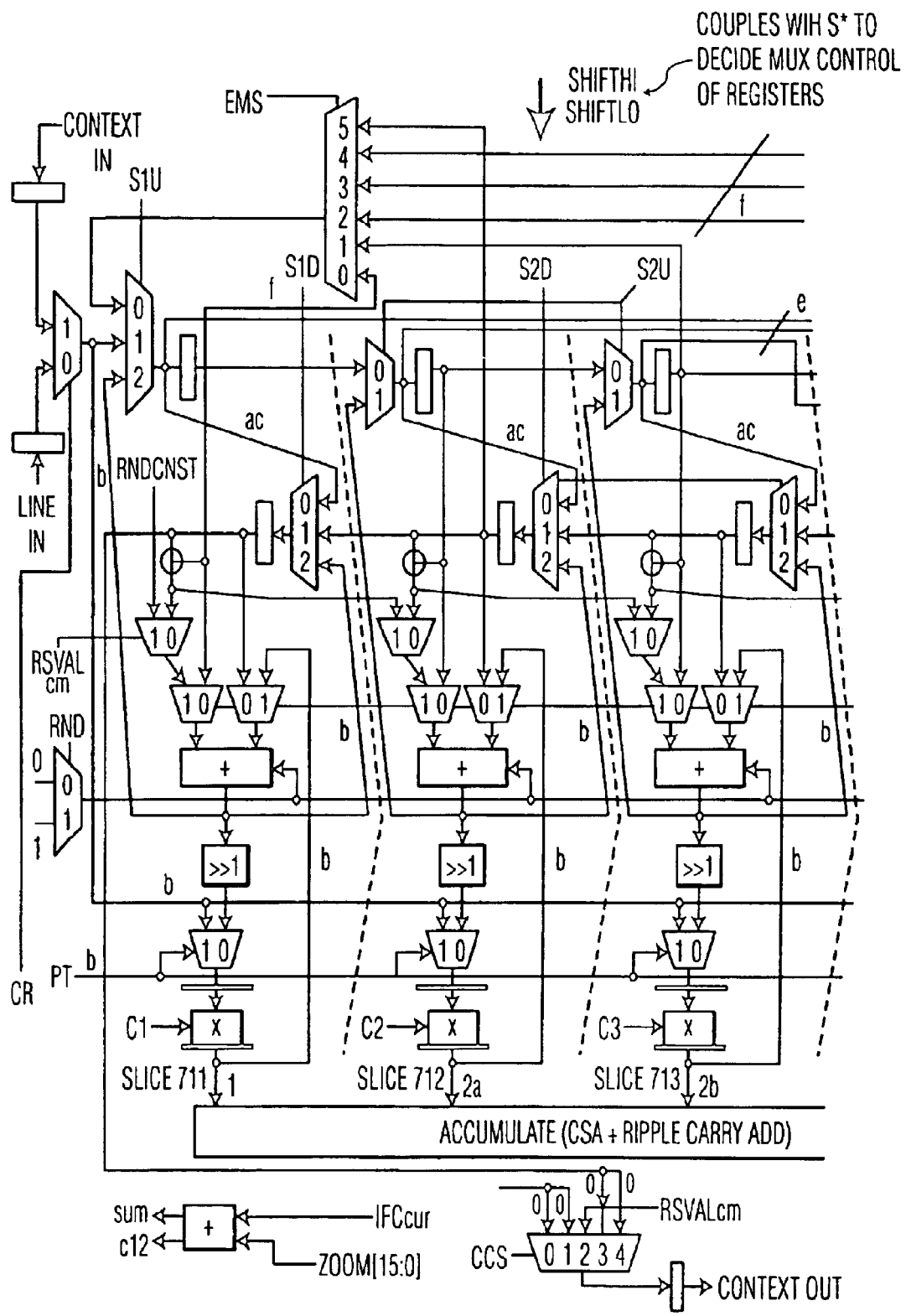
Figure 7B:
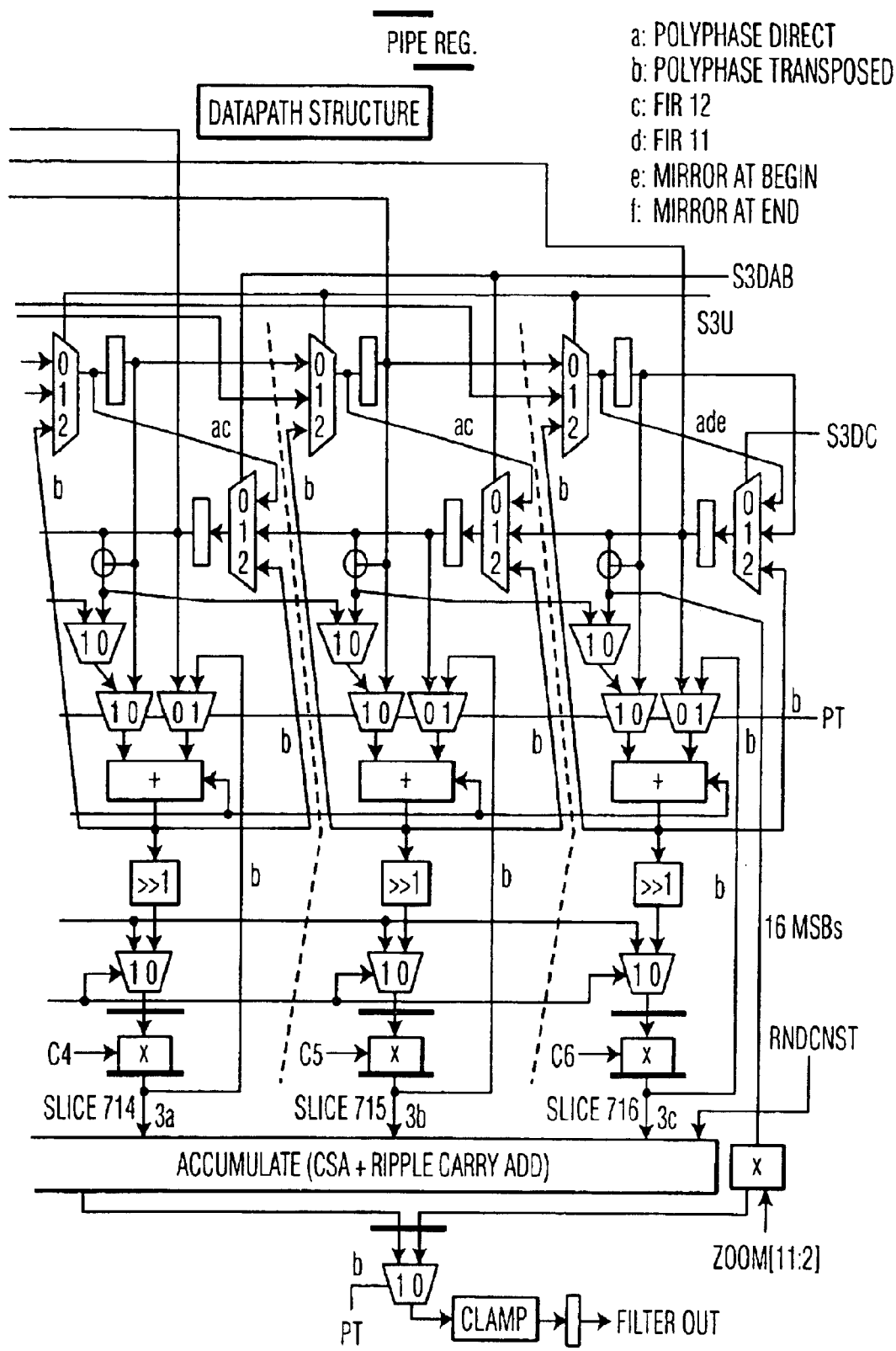

FIG. 7 illustrates an example implementation of the main-filter reconfigurable datapath module 228 of FIG. 2, which is responsible for the general arithmetic filter-processing functions. The module 700 is controlled by the HFL_dp_cntrl block 230 of FIG. 2. In connection with this example implementation, block 230 of FIG. 2 is written in RTL Verilog Design Language to synthesize and generate the circuit that controls and reconfigures the reconfigurable datapath block 228. Block 230 controls the input-data read from XBAR, output-data write to XBAR, coefficient-read from coefficient memory, context read from XBAR, and context write to XBAR. This module also provides various control signals for reconfiguring the datapath depending on the type of filtering (e.g. polyphase direct "PD", polyphase transposed "PT", FIR 11-tap, or FIR12-tap) and the processing requirements (left mirroring, no mirroring, right mirroring, rounding in FIR mode, etc.). In addition to using "PD" and "PT," other abbreviations include FIR (11/12) for FIR (11/12) filtering, MLE for left-edge mirroring, MRE for right-edge mirroring, LDCXT for loading context, and SVXT for saving context.

The module 230, that controls the datapath re-configuration and operations, is primarily a finite state machine ("FSM") with seven states and the main events taking place in these states are listed below:

1. DPCIDLE: If the Fdone signal (coming from a different state and signifying that the filtering operation is done) is HIGH, it is de-asserted and the FSM remains in this state until it receives the goFilter command from the top FSM, when the following operations take place:

incount and outcount - - - the number of input pixels consumed and the number of output pixels produced - - - are initialized and if MRE=1 (at the end of a picture line), the right-mirror counter (MCR) is initialized with the number of pixels to be mirrored (minus one since count down is until 0) depending on the filter type.

If LDCXT=1, the context read counter (CC) is loaded with the number of contextual values to be read depending on the filter type, a request is sent out for reading context, and the FSM jumps to state DPCW1.

If MLE=1, depending on the filter type, the left-mirror counter (MCL) is initialized with the number of pixels to be mirrored (minus one since count down is until 0), the filtering-event-flag (RSVAL), whose value decides whether to shift in more pixels without writing or to write back the results computed so far, is initialized, the position-and-phase counter (IFC) is initialized, and the mirroring pixels are requested (by asserting reqml that gets connected to HFL_next_rd1) from the XBAR (except when PT=1, where the input value is held for the mirroring period). The start_write signal is initialized to 0 for PT=1, since this signal is asserted at the end of the mirroring period to enable the datapath to write the results into the XBAR.

If the filtering has to start immediately without any context or mirroring action (that is, LDCXT=MLE=0 and the hardware has to continue from where it stopped in the previous processing step), the various control signals CR, S1U, S1D, S2U, S2D, S3U, S3DAB, S3DC, (in FIG. 7) controlling the multiplexers feeding the pixels into the datapath-registers, are reinitialized depending on the filter type and the FSM jumps to the state DPCFP.

2. DPCW1: If LDCXT=1, the mux controls (in FIG. 7) are set up appropriately for loading in the context values; otherwise, the mux controls are set up appropriately for left mirroring, depending on the filter type (except for the PT=1 case, where the setup is already correct). This is a delay state. The FSM jumps to DPCW2.

3. DPCW2: The FSM jumps to DPCW2. This is just an ordinary delay state.

4. DPCW3: If PD=1, the request for the left-mirroring pixels (reqml) is de-asserted since the request is already high for the required 3 cycles (for the 3-cycle latency) and gets the required 3 pixels. If MLE=1, then incount is adjusted for the already-consumed mirroring pixels and if the filter is not in the PT mode then the shift signals are asserted to prepare the datapath to shift pixels into the datapath-registers. The next FSM-state is DPCCM.

5. DPCCM: If LDCXT=1, then, depending on the filter type and the CC value, the context values - - - IFC (the updated and current pixel position), RSVAL (the difference between the previous and current pixel positions), the zoom parameters, and the datapath-register contents - - - are loaded in order, and CC is updated in each cycle. Depending on the filter type, the shift signals (oshifthi and oshiftlo necessary for shifting value into the upper or lower segments of the datapath registers) are also appropriately asserted and de-asserted to load in context values into the upper or lower part of the datapath-registers (upper part loaded first and then half way into the loading, shifting-in for the lower part starts). The request signal (reqc) for the context values are also asserted and de-asserted at appropriate times, so that the XBAR memory pointers are not incremented erroneously. The FSM jumps to DPCFP after loading context. If LDCXT=0 and the mode is not PT, then MCL is decremented in each cycle until it reaches 0 (at which point the FSM jumps to DPCFP), and depending on the value of the mirror counter: the request (reqml) for the mirror pixels is de-asserted after keeping it on for a number of cycles equal to the number of pixels required for mirroring, the datapath-mux control (S3U) is de-asserted, and the datapath-register shift signals (oshifthi and oshiftlo) are de-asserted. After the mirroring is done and the mirror pixels are already in the datapath-registers, all datapath-mux controls are set up for the filtering operations (depending on the filter type).

6. DPCFP: This is the state where the actual filtering operation happens. Without going into too much details, the basic idea of what goes on in this state is as follows: Until incount and outcount are zero, the simultaneous zero values signifying the end of the processing step, the position of the output pixel and its phase are continuously calculated.

The phase information is used to look up the coefficients from the coefficient memory. For the PD case (FIR case is similar to PD with constant phase and zoom being equal to 1), IFC and RSVAL are updated as: IFC(t)=IFC(t−1)+1/zoom; RSVAL=Integer part of [IFC(t)−IFC(t−1)] and any time RSVAL>0, as determined by an appropriate carry out from the fractional part of the zoom register (as described in connection with FIG. 8), it is decremented and input pixels are shifted in until RSVAL=0, at which point the filter output is written to the XBAR. For the PT case, IFC(t)=IFC(t−1)+zoom; RSVAL=Integer part of [IFC(t)−IFC(t−1)] and as long as RSVAL=0, input pixels are read and shifted in until the point that RSVAL becomes greater than 0, when the filter output is written to the XBAR. Right mirroring for all types of filters are also taken care of in this state by appropriately controlling the mirror counters and the datapath-mux controls.

Special care is taken to perform pre-computation of the position and the phase in the PD mode (using signals bflag and RSVALnxt to differentiate it from RSVALcur or RSVAL, as it has been used in this writeup). Without pre-computation, where the next position and phase are calculated without stopping even when the current position and phase demands a write of the filtered value to the xbar, one cycle will be lost to write. The filter result to the xbar and so n pixels processed with zoom=0.5 will take an unacceptable 2n cycles in the worst case.

Because the datapath is pipelined, the decision to write the filtered results to the XBAR is propagated, as the write-request, through a number of flip-flops, so that this signal arrives at the XBAR at the same time that the output data arrives. Similarly, the address (phase) of the coefficients and the actual coefficients from the coefficient memory are also propagated through varying number of flip-flops, so that the multiplier coefficients arrive at the datapath at the correct time (after accounting for the XBAR memory read latent and the datapath pipeline).

If SVCXT=1, the datapath-mux controls are set so that the context values can be written out and the FSM jumps to DPCCO; otherwise, the FSM returns to its DPCIDLE state after asserting the end_of_op signal.

7. DPCCO: This state is for context out when SVCXT=1. Depending on the filter type and the CC value, CC is updated in each cycle and the datapath-context-out-mux control (CCS) is assigned in order to write the correct context values. After writing out the context, the FSM jumps back to its DPCIDLE state.

Figure 8:
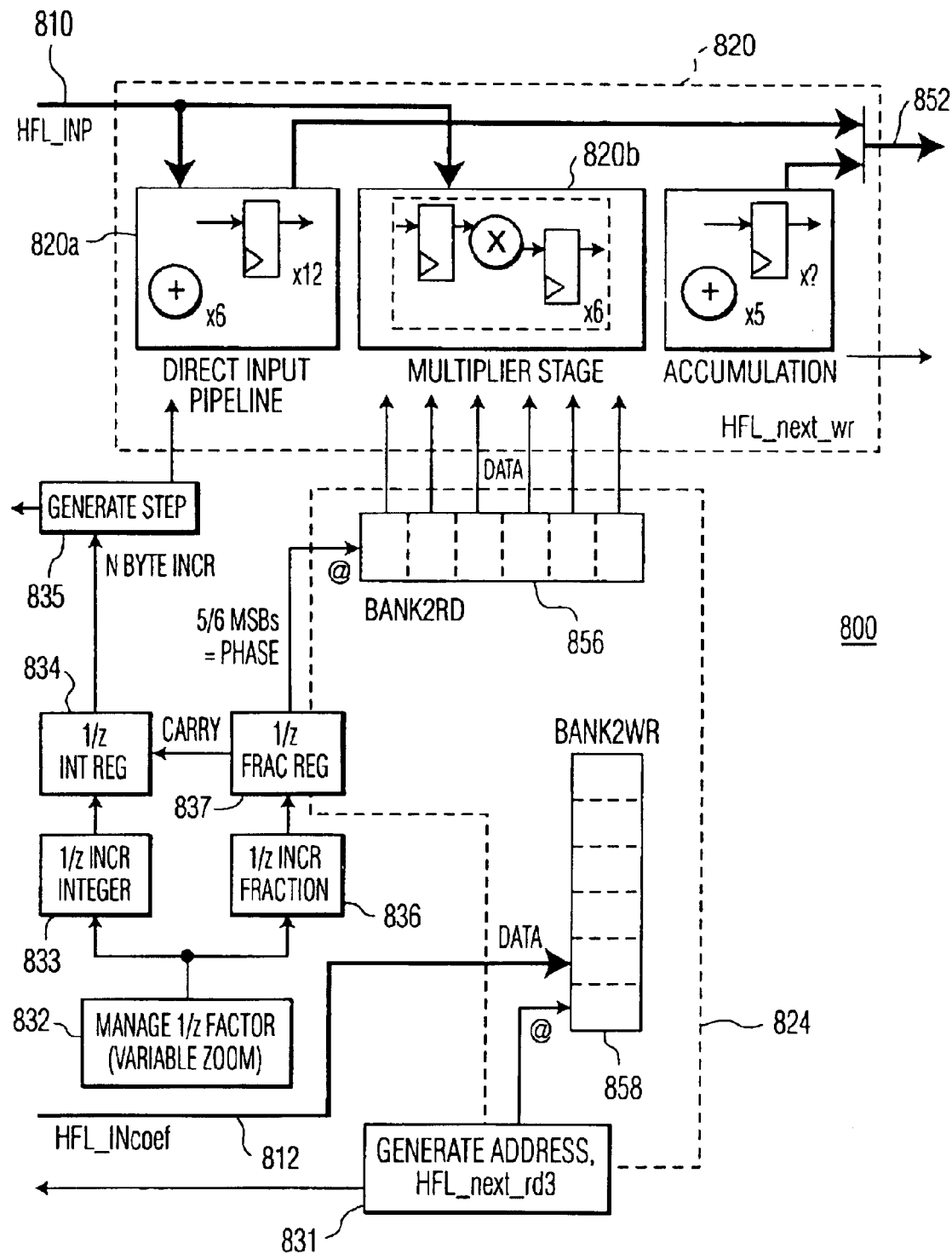

In view of the above-described functionality of the components, the details of the datapath module 700 are best understood using the horizontal filter 800 shown in FIG. 8. More particularly, FIG. 8 shows a central filter macro-module including some specific features of the datapath and control modules (224, 228 and 230 of FIG. 2) generally depicted as the six similarly-constructed slices 711–716 of FIG. 7. The inputs to the horizontal filter 800 are pixels along the HFL_IN pixel line 810, and filter coefficient data along the HFL_IN coefficient line 812. The pixels are received by the datapath 820, the filter coefficient data are received by coefficient memory circuit 824, the coefficient-memory addressing is provided by circuit 831, and circuits 832–837 provide the mechanism to decide the current phase and hence the particular set of coefficients to use and the action (shift in new input pixel or continue to produce the next output without reading in any new pixel) in the next clock cycle.

The data path 820 includes six parallel addition circuits, one of which is shown at 820a, feeding a multiplier stage 820b. The multiplier stage 820b has six parallel multiplication circuits, only one of which is shown. The outputs of the six parallel multiplication circuits 820b are fed back as inputs to the respectively arranged addition circuits 820a, and outputs from each of the first five parallel addition circuits 820a feed forward as accumulating inputs to the next of the parallel addition circuits 820a. The last of the parallel addition circuits 820a is an accumulated value that drives the multiplier stage in the last slice, the output of which provides the filtered/scaled horizontal pixel value at line 852. Once memory bank 856 has been written (filled) with filter coefficients, it is ready to be read by the filter datapath in the next processing step (so that the filtering operation can potentially proceed), whereas bank 858 can now optionally be written into with a new set of coefficient values. Circuits 832–837 are responsible for updating the zoom values and, therefore, computation of the current phase (for the current output position with respect to the input) that determines the coefficient-memory-bank address to read out the set of coefficients to be used in the subsequent clock cycle; this phase also determines the action to be taken in the next clock cycle (e.g., shift in new input pixel or continue to produce the next output without reading in any new pixel). The zoom value (or its inverse, depending on the polyphase filter mode used) is updated every clock and the fractional part of the incremented value yields the current phase. The calculated fractional part (836) and the calculated integer part (833) are stored in registers (837 and 834, respectively). It is the carry-out from the fractional part (837) to the integer part (834), as obtained in the zoom-update calculation, that determines the action mentioned above. The write_memory bank 858 is loaded from the HFL_INcoefficient signal in response the HFL_nxt_rd3 signal.

Figure 9:
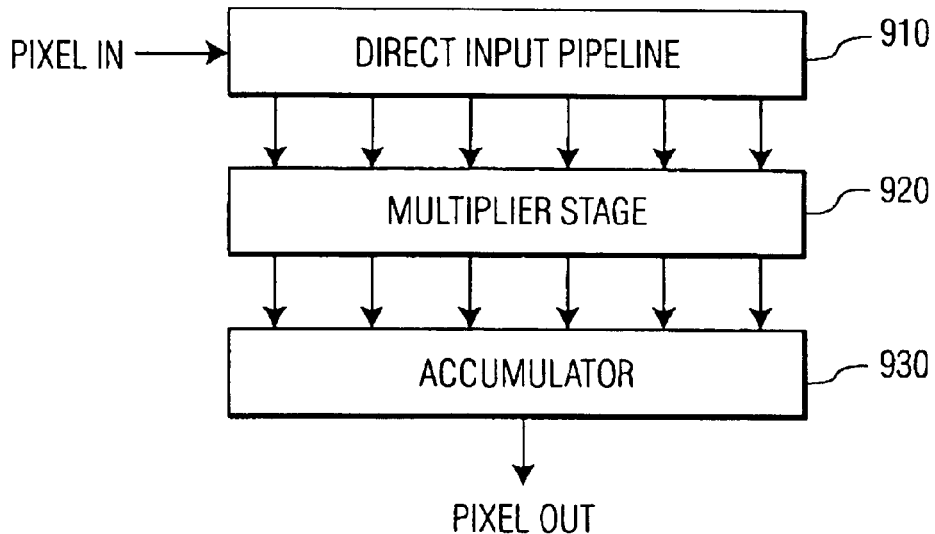
FIG. 9 is a data circuit/flow diagram depicting a datapath configuration for the filter arithmetic using in connection with the modules of FIG. 8.

As shown in FIG. 9 and consistent with the data path 820 of FIG. 8, the datapath configuration used for the filter arithmetic can be viewed as having three main parts, a direct input pipeline 910, a multiplier stage 920 and an accumulator 930. The direct input pipeline 910 prepares the values to be sent to the multipliers (in this instance, a.k a., "direct input pipeline"). The multiplier stage 920 is a stage of multiplier circuits that multiplies the coefficients times the values coming from the direct input pipeline 910. The accumulator 930 realizes the sum of the six results of multiplication and accumulation.

Figure 10:
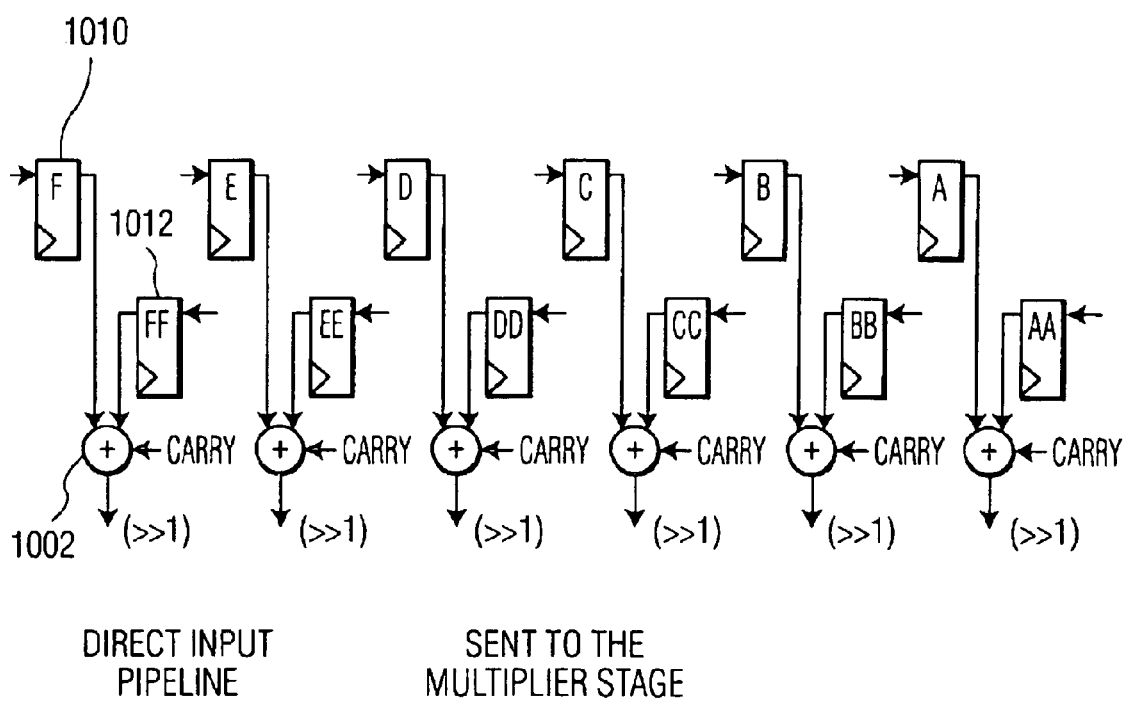
FIG. 10 is a data circuit/flow diagram depicting an input pipeline structure used for a particular Polyphase-Direct filtering application in connection with the datapath configuration shown in FIGS. 8 and 9.

The direct-input pipeline 910 of FIG. 9 is adapted to handle 12 pixel values and perform the additions for symmetrical FIR applications. A more-detailed example implementation of the direct-input pipeline is shown via the input pipeline structure of FIG. 10. In FIG. 10, the pixel values are stored in twelve different registers. Essentially, each of six stages includes an adder 1002 adapted to add the respective outputs of flip-flops 1010 and 1012. The respective inputs of flip-flops 1010 and 1012 are connected to ports selected based on the configuration of the filter. Each of the adders may also receive a carry_in value provided from the previous stage.

Figure 11:
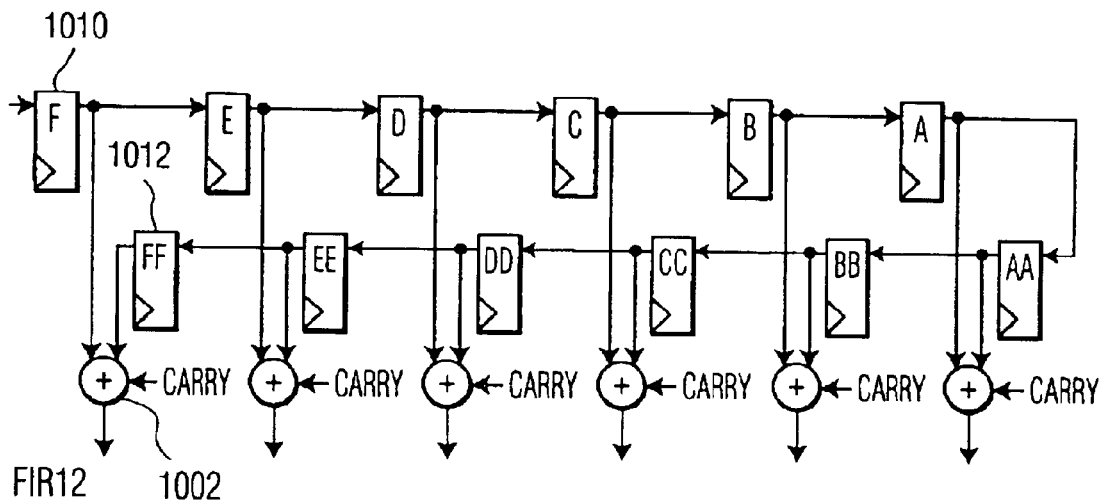
FIG. 11 is a data circuit/flow diagram depicting another configuration of the circuitry of FIG. 10 for a particular application (FIR 12), according to the present invention.
Figure 12:
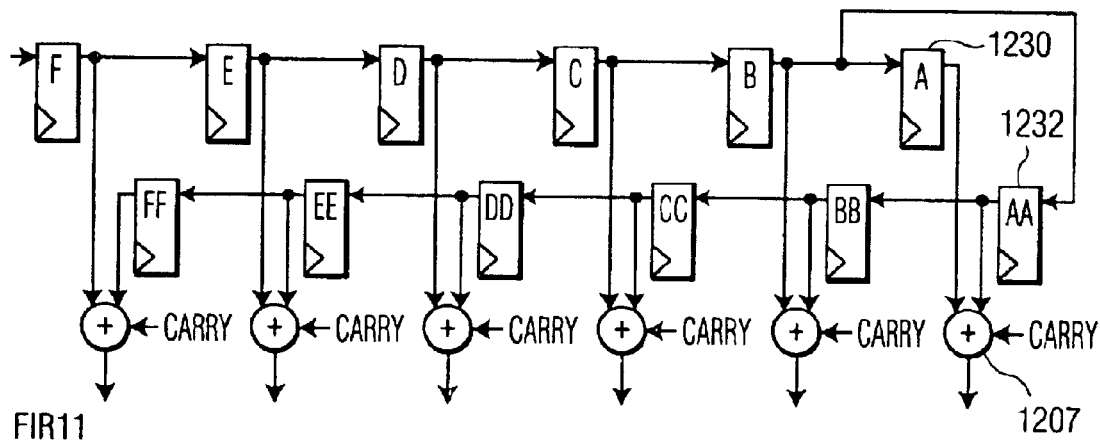
FIG. 12 is a data circuit/flow diagram depicting another configuration of the circuitry of FIG. 10 for a particular application (FIR 11), according to the present invention.
Figure 13:
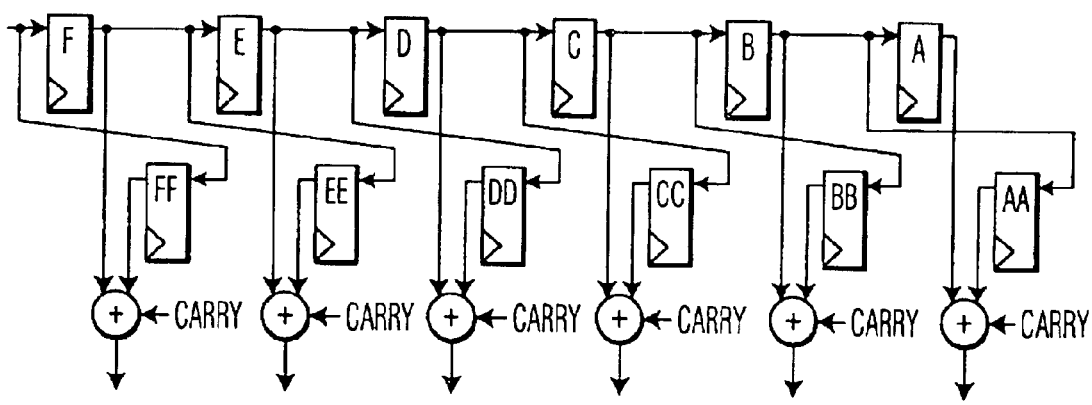
FIG. 13 is a data circuit/flow diagram depicting another configuration of the circuitry of FIG. 10 for a particular Polyphase-Transposed filtering application, according to the present invention.

FIG. 11 shows how these twelve registers of FIG. 10 are configured to connect to the adders while the three following figures (FIGS. 12–14) represent the data flow when a new pixel is shifted in as defined by increments of the 1/z integer register (834 of FIG. 8); if no pixel is shifted in, each register keeps its last value (not shown in FIG. 11). In the case of a 12-tap symmetrical FIR configuration, each register is simply connected to the previous as shown in FIG. 11. In the case of an 11-tap symmetrical FIR configuration, the two registers A and AA (numerically denoted 1230 and 1232 in FIG. 12) receive the same value, so that after the pipeline is initialized with data for more than eleven pixels shifted-in, the value in[pos+5] is stored in both of them. As a consequence, the output of the sixth adder (1207 of FIG. 12) is still in[pos+5]; this follows mathematically in view of the relationship $X+X+\text{carry}>>1=X.$ FIG. 13 shows how these twelve registers of FIG. 10 are configured in the case of a 6-tap Polyphase filter. In this configuration and to use the same property mentioned above, each shifted-in value is stored in two registers and these two registers are connected to the same adder.

Referring now to the datapath shown in FIG. 7, the functional unit that contains the datapath features HFL_dp_slice1 (one time), HFL_dp_slice2 (two times), HFL_dp_slice3 (3 times), and HFL_dp_slice4 (one time), where the fourth slice corresponds to the circuitry shown in FIG. 7 other than the circuitry of the six slices 711 through 716. To have re-usable code, most of the circuitry in each slice is a design common to each of the six slices 711 through 716; this identical circuitry ("HFL_dp_common" initiated inside each slice) is exemplified by all of the circuitry shown in slice 713 except for multiplexer 718.

Figure 14:
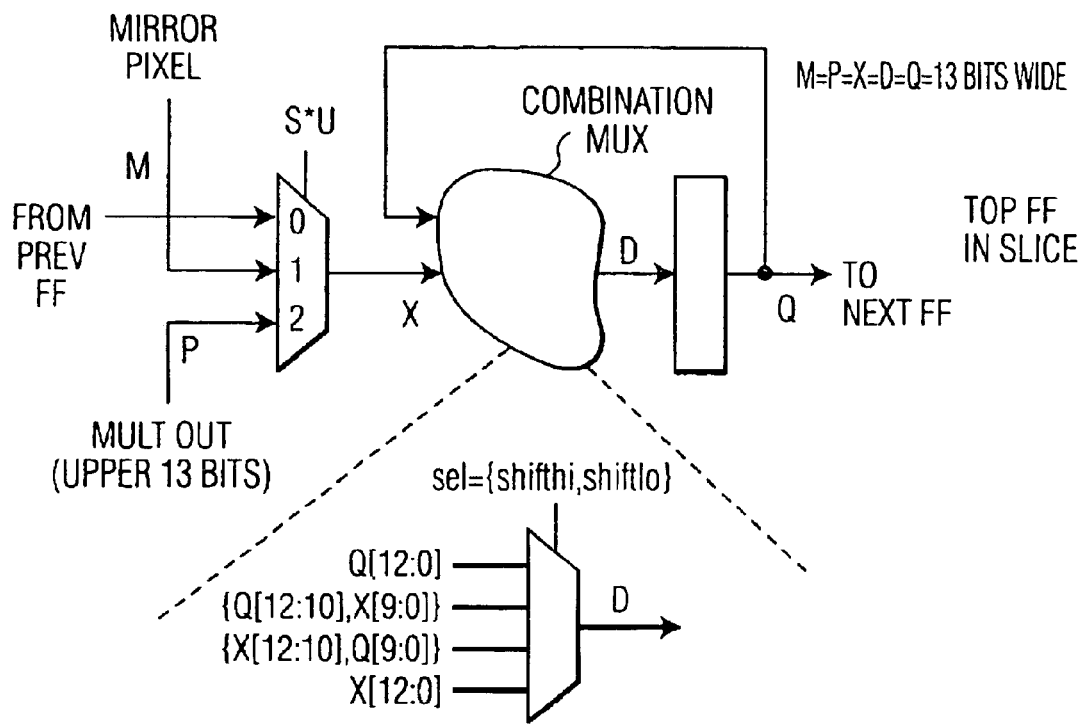
FIGS. 14 and 15 are circuit diagrams showing multiplexer arrangements for the respective top and bottom flip-flops of similarly constructed "slice" circuits used in the reconfigurable circuit arrangement of FIG. 7, according to the present invention.
Figure 15:
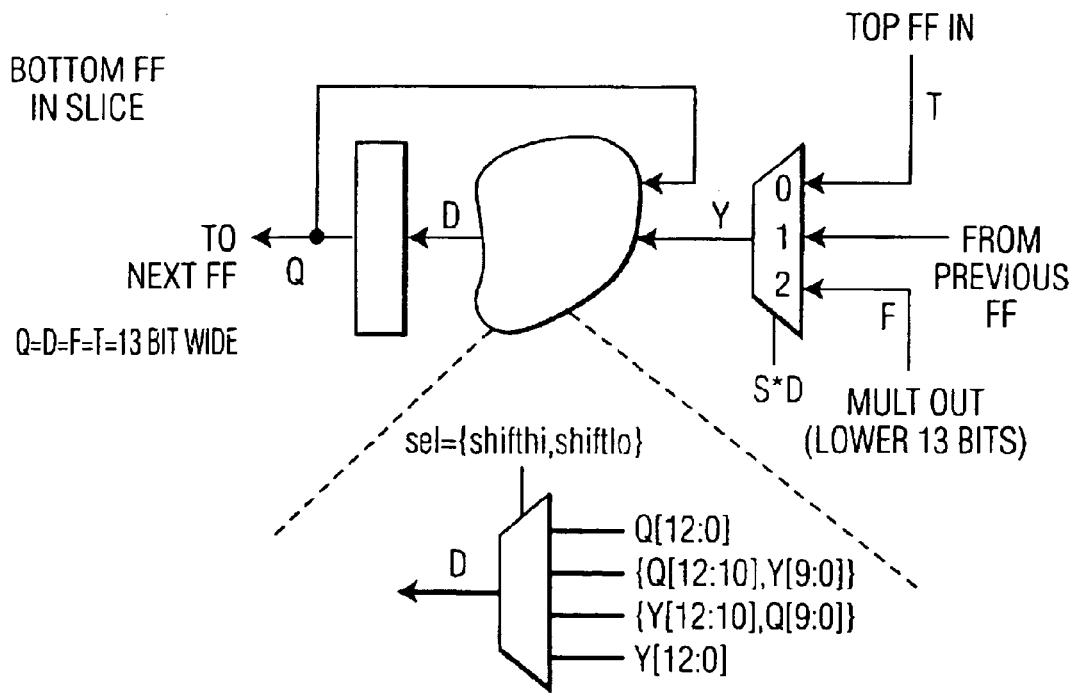

As illustrated above in connection with FIGS. 10–13, the datapath of FIG. 7 has a re-configurable connection of 12 flip-flops ("FF"). The reconfiguration is based on the type of filter and the current operation type (context read, filter, context save). The reconfiguration of the FFs is effected via suitable selection of select signals to various strategically multiplexers. The datapath control FSM (with the seven states as described earlier) is responsible for generating the right control signals at the right times. It will be appreciated that each FF depicted in FIG. 7 is actually a FF-based circuit having a top FF part and a bottom FF part, each of which can be loaded separately using the shifhi and the shiftlo signals, respectively. The top and the bottom FFs, whose inputs are provided by the multiplexers (that are connected to S*, i.e., S1U, S1D, S2U, etc. in FIG. 7) are actually implemented as multiplexer FFs where the multiplexer (not shown) is actually controlled by the shifthi and shiftlo signals. FIGS. 14 and 15 show the multiplexer ("mux") arrangements for the respective top and bottom of the similarly-constructed "slice" circuits used in the reconfigurable circuit arrangement of FIG. 7.

Before discussing certain additional features and aspects of FIG. 7, the twelve flip-flops (in the 2 rows) have been labeled in the clockwise direction from 1 to 12, where the leftmost FF in the upper row is numbered 1, the rightmost FF in the upper row is numbered 6, the rightmost FF in row 2 is numbered 7, and the leftmost FF in row 2 is numbered 12. Further, in the following discussion, the ith FF is referred to as FFi, where i is an integer between 1 and 12.

1. The lines marked by letters a, b, c, . . . , f denote the lines where data flows for the specific situations, e.g., "ae" implies that the line is active for cases "a" (Polyphase Direct) and "e" (Mirroring at the beginning of a line). The explanations for these letters are given on the top right-hand corner of FIG. 7

2. Fir mirroring at the beginning of a line, e.g., in the Polyphase Direct case, the first three pixel values read in should not only feed into FFs 1 to 3, but also to FFs 4 to 6 in the opposite order; this provides the pattern: p3 p2 p1 p1 p2 p3, where pi denotes the ith pixel read in. This pattern is accomplished by programming (from the datapath-control state machine) multiplexer select CR=0 (so that LINE IN goes through), S1U=1, S2U=0, and S3U=1 (so that FF1, FF2, and FF3 are connected in a shift register fashion and the three pixels read in just shift through (as p3, p2, p 1) whereas whatever shifts into FF1, FF2, and FF3 also gets shifted into FF6, FF5, and FF4, respectively in order to achieve the mirroring.

3. In the above mode, the lower FFs (7 to 12) should have the same values as the top FFs (6 to 1). This goal is accomplished by programming the multiplexer selects as S1D=S2D=S3DAB=S3DC=0. As can be seen, this scheme ties the multiplexed input of the lower FFs to the inputs of the top FFs so that the top and the bottom-row FFs shift in the same values.

4. For mirroring at the end of a line, the first three FFs (1 to 3) in the top row receive the same values as the last three FFs (4 to 6), but in the opposite order. Therefore, for the clock-cycles in which the last three values shift into FFs 4 to 6, the S1U=0 is programmed and then changed (per clock cycle) EMS appropriately so that the feed-back paths fill FFs 1 to 3 with values equal to those in FFs 6 to 4.

5. The signal "RND" is the multiplexer binary-select signal that, when true, allows rounding by providing a carry of digital one to the adders.

6. In the Polyphase Transposed filtering mode, where PT=1, the multiplexers in front of the multipliers select the multiplier inputs to come directly from LINE IN and the multiplier outputs (different coefficient times the same input) are sent to the adders in order for them to be accumulated and stored in the registers. The top and bottom registers, in each slice forming a pair, are used to store a high precision value for the accumulation. For all other modes, however, PT=0; hence, the contents of the top and the bottom registers of each pair in a slice are first added and right-shifted, and then multiplied by the coefficients. Consequently, appropriate control signals, from the datapath-control FSM, allow for different ordering of arithmetic operations depending on the filtering mode: multiplication followed by accumulation in PT and addition followed by multiplication otherwise.

Accordingly, various embodiments of the present invention can be realized to provide a hardware-reconfigurable digital filter having multiple filtering modes including any combination selected from (but not necessarily limited to) the set of polyphase direct, polyphase transposed, FIR 11-tap, and FIR 12-tap. The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention that is set forth in the following claims.

What is claimed is:

1. A hardware-reconfigurable digital filter having multiple filtering modes, comprising:

logic circuitry adapted to process data corresponding to input data, the logic circuitry including logically arrayed in an X-by-Y logical array of registers for supporting at least one first filtering mode using the registers arranged in a linear configuration which at least two rows of the logical array of registers are coupled together to form a single linear shift register and for supporting at least one second filtering mode using the registers arranged nonlinearly in a configuration different than said linear configuration, wherein each of X and Y is at least 2;

computational circuitry adapted to perform computations responsive to the logic circuitry and including at least Y multiplication logic circuits and at least Y addition logic circuits; and mode selection circuitry adapted to switch the digital filter between the multiple filtering modes.

2. The hardware-reconfigurable digital filter of claim 1, wherein the logic circuitry and the computational circuit are configurable, in response to the mode selection circuitry, to operate in at least two of the following filtering modes: polyphase direct, polyphase transposed, finite-impulse response 11-tap, and finite-impulse response 12-tap.

3. The hardware-reconfigurable digital filter of claim 1, wherein each of the multiplication and addition logic circuits along a Y-axis direction has reconfiguration circuitry adapted to reconfigure the multiplication and addition logic circuits along the Y-axis direction the logic circuitry in response to the mode selection circuitry, and the first filtering mode supports an impulse response filtering mode and the second filtering mode supports at one polyphase filtering mode and another impulse response filtering mode.

4. The hardware-reconfigurable digital filter of claim 1, wherein the logic circuitry and the computational circuitry are configurable to operate in one of the following filtering modes: a polyphase direct filtering mode, a polyphase transposed filtering mode, and a FIR filtering mode.

5. The hardware-reconfigurable digital filter of claim 4, wherein the mode selection circuitry adapted to switch the digital filter between the polyphase transposed filtering mode and another one of the modes.

6. The hardware-reconfigurable digital filter of claim 5, wherein the mode selection circuitry includes a first selection circuit adapted to switch the digital filter into the polyphase transposed filtering mode, and a second selection circuit adapted to switch the digital filter between modes other than the polyphase transposed filtering mode.

7. The hardware-reconfigurable digital filter of claim 6, wherein the first selection circuit is adapted to reconfigure the computational circuitry, and the second selection circuit is adapted to reconfigure the logic circuitry.

8. The hardware-reconfigurable digital filter of claim 6, wherein the modes other than the polyphase transposed filtering mode include a polyphase direct filtering mode, and two FIR filtering modes, one of the FIR filtering modes including more taps than the other of the two FIR filtering modes.

9. The hardware-reconfigurable digital filter of claim 1, wherein the logic circuitry and the computational circuit are configurable to support saving and loading video data for context switching and switching back and forth among multiple long input lines.

10. The hardware-reconfigurable digital filter of claim 1, wherein a plurality of the registers in the array is adapted as sliced circuits along an axis defined by an alignment of the Y registers.

11. The hardware-reconfigurable digital filter of claim 1, wherein each of a first plurality of the registers in the array is adapted as a first sliced circuit along an axis defined by an alignment of the Y registers, and each of a second plurality of the registers in the array is adapted as a second sliced circuit along an axis defined by an alignment of the Y registers.

12. A hardware-reconfigurable digital filter having multiple filtering modes, comprising:

logic circuitry adapted to process and mirror data corresponding to filter inputs about a data point corresponding to selected target node in a video image segment, the logic circuitry including registers arrayed in an X-by-Y logical array of registers, wherein Y is greater than X and X is at least 2;

a computational circuit adapted to perform computations responsive to the logic circuitry and including at least Y multiplication logic circuits and at least Y addition logic circuit; and mode selection circuitry adapted to direct the digital filter into a mode for performing polyphase transposed filtering by configuring the logic circuitry and the computational circuitry for processing data using the registers in a in a linear configuration which at least two rows of the logical array of registers are coupled together to form a single linear shift register and to direct the digital filter into another filtering mode by configuring the logic circuitry and the computational circuitry for processing data using the registers in a nonlinear configuration different than said linear configuration.

13. The hardware-reconfigurable digital filter of claim 12, wherein a plurality of the registers in the array is adapted as sliced circuits.

14. The hardware-reconfigurable digital filter of claim 12, wherein a plurality of the registers in the array is adapted as sliced circuits along an axis defined by an alignment of the Y registers.

15. The hardware-reconfigurable digital filter of claim 12, wherein each of a first plurality of the registers in the array is adapted as a first sliced circuit along an axis defined by an alignment of the Y registers, and each of a second plurality of the registers in the array is adapted as a second sliced circuit along an axis defined by an alignment of the Y registers.

16. The hardware-reconfigurable digital filter of claim 12, wherein X is equal to two and Y is not less than 6, and wherein the multiple filtering modes include the polyphase transposed filtering mode, a polyphase direct filtering mode, and two FIR filtering modes, one of the FIR filtering modes including more taps than the other of the two FIR filtering modes.

17. The hardware-reconfigurable digital filter of claim 16, wherein one of the FIR filtering modes includes 12 taps.

18. A hardware-reconfigurable digital filter having multiple filtering modes, comprising:

logic means for processing data corresponding to input data, the logic means including logically arrayed in an X-by-Y logical array of registers for supporting at least one first filtering mode using the registers arranged in a linear configuration which at least two rows of the logical array of registers are coupled together to form a single linear shift register and for supporting at least one second filtering mode using the registers arranged in a nonlinear configuration different than said linear configuration, wherein each of X and Y is at least 2;

selection means adapted to switch the digital filter between different ones of the multiple filtering modes; and computational means adapted to perform computations responsive to the logic means and including at least Y multiplication logic circuits and at least Y addition logic circuits.

19. A hardware-reconfigurable digital filter having multiple filtering modes, comprising:

logic means for processing and mirroring data corresponding to filter inputs about a data point corresponding to selected target node in a video image segment, the logic circuitry including registers logically arranged in an X-by-Y logical array of registers for supporting at least one first filtering mode using the registers arranged in a linear configuration which at least two rows of the logical array of registers are coupled together to form a single linear shift register and for supporting at least one second filtering mode using the registers arranged in a nonlinear configuration different than said linear configuration, wherein Y is greater than X and X is at least 2;

means for switching the digital filter between a polyphase transposed filtering mode and at least one other mode of the multiple filtering modes; and means for performing computations responsive to the logic means and including at least Y multiplication logic circuits and at least Y addition logic circuits, each of the multiplication and addition logic circuits having reconfiguration means responsive to the switching means.

20. The hardware-reconfigurable digital filter of claim 19, wherein sets of the Y multiplication logic circuits and Y addition logic circuits are sliced circuits.

21. A hardware-reconfigurable digital filter having multiple filtering modes, comprising:

logic circuitry adapted to process data corresponding to input data, the logic circuitry including a 2-by-6 logical array of registers for supporting a 12-tap FIR filtering mode using the registers arranged in a linear configuration which at least two rows of the logical array of registers are coupled together to form a single linear shift register and, using the registers arranged in a nonlinear configuration different than said linear configuration, for supporting an 11-tap FIR filtering mode in which two of the registers at an end of the array are paired, a polyphase direct filtering mode in which each of six pairs of the registers is used to combine a single input to the pair, and polyphase transposed filtering mode in which six pairs of the registers are used to provide a wide bitwidth corresponding to a high-precision number;

computational circuitry adapted to perform computations responsive to the logic circuitry and including a multiplication logic circuit and an addition logic circuit, separately arranged, for receiving and processing data from each of the six pairs of registers; and mode selection circuitry adapted to switch the digital filter between the multiple filtering modes.

* * * * *